US012684972B2

(12) United States Patent
Jin et al.

(10) Patent No.: US 12,684,972 B2
(45) Date of Patent: Jul. 14, 2026

(54) DISPLAY APPARATUS

(71) Applicant: Samsung Display Co., Ltd., Yongin-si (KR)

(72) Inventors: Guanghai Jin, Yongin-si (KR); Yongseog Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 357 days.

(21) Appl. No.: 18/472,143

(22) Filed: Sep. 21, 2023

(65) Prior Publication Data

US 2024/0237440 A1 Jul. 11, 2024

(30) Foreign Application Priority Data

Jan. 5, 2023 (KR) ........................ 10-2023-0001942

(51) Int. Cl.
| | |
|---|---|
| *H10K 59/131* | (2023.01) |
| *H10K 59/88* | (2023.01) |
| *H10W 46/00* | (2026.01) |

(52) U.S. Cl.
CPC ........... *H10K 59/131* (2023.02); *H10K 59/88* (2023.02); *H10W 46/00* (2026.01)

(58) Field of Classification Search
CPC ...................................................... H10K 59/88
See application file for complete search history.

(56) References Cited

U.S. PATENT DOCUMENTS

| | | | |
|---|---|---|---|
| 9,852,996 | B2 | 12/2017 | Xu et al. |
| 10,109,688 | B2 | 10/2018 | Han |
| 2010/0118252 | A1 | 5/2010 | Tseng et al. |
| 2011/0139493 | A1 | 6/2011 | Sumida et al. |

FOREIGN PATENT DOCUMENTS

| | | |
|---|---|---|
| CN | 103926716 A | 7/2014 |
| CN | 104460155 A | 3/2015 |
| CN | 108594548 A | 9/2018 |
| JP | H 11-007047 A | 1/1999 |

*Primary Examiner* — Matthew L Reames
(74) *Attorney, Agent, or Firm* — Womble Bond Dickinson (US) LLP

(57) ABSTRACT

A display apparatus includes: a substrate including a display area and a peripheral area; a pad portion on one side of the peripheral area; a first connection group including a plurality of first connection lines extending from the pad portion to the display area; a second connection group including a plurality of second connection lines extending from the pad portion to the display area, wherein the second connection group is adjacent the first connection group; a first main mark on a first side of the first connection group; a second main mark on a second side of the first connection group and between the first connection group and the second connection group; a plurality of first sub-marks between the plurality of first connection lines of the first connection group; and a plurality of second sub-marks between the plurality of second connection lines of the second connection group.

17 Claims, 11 Drawing Sheets

FIG. 10

DISPLAY APPARATUS

CROSS-REFERENCE TO RELATED APPLICATION

The present application claims priority to and the benefit of Korean Patent Application No. 10-2023-0001942, filed on Jan. 5, 2023, in the Korean Intellectual Property Office, the entire disclosure of which is incorporated herein by reference.

BACKGROUND

1. Field

Aspects of one or more embodiments relate to a display apparatus.

2. Description of the Related Art

A display apparatus visually displays data. A display apparatus may be used as a display unit of miniaturized products such as mobile phones, and may be used as a display unit of large-scale products such as televisions.

A display apparatus includes a plurality of pixels that receive electric signals and emit light to display images to the outside. Each pixel includes a display element. An organic light-emitting display apparatus includes, for example, an organic light-emitting diode. Generally, an organic light-emitting display apparatus includes a thin-film transistor and an organic light-emitting diode over a substrate, and operates while the organic light-emitting diode emits light in response to data signals.

Recently, as uses of display apparatuses has diversified, various attempts have been made to a design to improve the quality of the display apparatus.

The above information disclosed in this Background section is only for enhancement of understanding of the background and therefore the information discussed in this Background section does not necessarily constitute prior art.

SUMMARY

Aspects of one or more embodiments include a display apparatus in which an inspection speed of a display panel is increased by increasing identification of marks for numbering connection lines respectively electrically connected to data lines.

Characteristics of embodiments according to the present disclosure are not limited to the characteristics mentioned above, and other characteristics that are not mentioned will be clearly more understood by those of ordinary skill in the art from the description of the disclosure.

Additional aspects will be set forth in part in the description which follows and, in part, will be apparent from the description, or may be learned by practice of the presented embodiments of the disclosure.

According to one or more embodiments, a display apparatus includes a substrate including a display area and a peripheral area surrounding at least a portion of the display area, a pad portion arranged on one side of the peripheral area, a first connection group including a plurality of first connection lines extending from the pad portion to the display area, a second connection group including a plurality of second connection lines extending from the pad portion to the display area, where the second connection group is adjacent to the first connection group, a first main mark located on one side of the first connection group, a second main mark located on another side of the first connection group and located between the first connection group and the second connection group, a plurality of first sub-marks each located between the plurality of first connection lines of the first connection group, and a plurality of second sub-marks each located between the plurality of second connection lines of the second connection group.

According to some embodiments, the plurality of first connection lines of the first connection group may be numbered based on the first main mark and the plurality of first sub-marks, and the plurality of second connection lines of the second connection group may be numbered based on the second main mark and the plurality of second sub-marks.

According to some embodiments, the first connection group may include a first convex portion, a second convex portion, and a first concave portion between the first convex portion and the second convex portion, the second connection group may include a third convex portion, a fourth convex portion, and a second concave portion between the third convex portion and the fourth convex portion, the first main mark may be located on one side of the first concave portion of the first connection group, and the second main mark may be located between the first concave portion of the first connection group and the second concave portion of the second connection group.

According to some embodiments, (1-1)st sub-marks in the plurality of first sub-marks may be located in the first convex portion of the first connection group, (1-2)nd sub-marks in the plurality of first sub-marks may be located in the second convex portion of the first connection group, (2-1)st sub-marks in the plurality of second sub-marks may be located in the third convex portion of the second connection group, and (2-2)nd sub-marks in the plurality of second sub-marks may be located in the fourth convex portion of the second connection group.

According to some embodiments, some of the plurality of first connection lines corresponding to the first convex portion of the first connection group may have first protrusions, others of the plurality of first connection lines corresponding to the second convex portion of the first connection group may have second protrusions, some of the plurality of second connection lines corresponding to the third convex portion of the second connection group may have third protrusions, others of the plurality of second connection lines corresponding to the fourth convex portion of the second connection group may have fourth protrusions, the (1-1)st sub-marks may each be located between the first protrusions, the (1-2)nd sub-marks may each be located between the second protrusions, the (2-1)st sub-marks may each be located between the third protrusions, and the (2-2)nd sub-marks may each be located between the fourth protrusions.

According to some embodiments, the first protrusions may include (1-1)st protrusions protruding in a first direction and (1-2)nd protrusions protruding in a second direction opposite to the first direction, the second protrusions may include (2-1)st protrusions protruding in the first direction and (2-2)nd protrusions protruding in the second direction, the third protrusions may include (3-1)st protrusions protruding in the first direction and (3-2)nd protrusions protruding in the second direction, the fourth protrusions may include (4-1)st protrusions protruding in the first direction and (4-2)nd protrusions protruding in the second direction, the (1-1)st protrusions and the (1-2)nd protrusions may be alternately arranged, the (2-1)st protrusions and the (2-2)nd protrusions may be alternately arranged, the (3-1)st protrusions and the (3-2)nd protrusions may be alternately arranged, and the (4-1)st protrusions and the (4-2)nd protrusions may be alternately arranged.

According to some embodiments, the (1-1)st sub-marks and the (2-1)st sub-marks may each include an odd number, and the (1-2)nd sub-marks and the (2-2)nd sub-marks may each include an even number.

According to some embodiments, the plurality of first sub-marks may be located in one of the first convex portion and the second convex portion of the first connection group, and the plurality of second sub-marks may be located in one of the third convex portion and the fourth convex portion of the second connection group.

According to some embodiments, some of the plurality of first connection lines corresponding to one of the first convex portion and the second convex portion of the first connection group may have a zigzag pattern, and some of the plurality of second connection lines corresponding to one of the third convex portion and the fourth convex portion of the second connection group may have a zigzag pattern.

According to some embodiments, the plurality of first sub-marks may include (1-1)st sub-marks and (1-2)nd sub-marks located in different rows, and the plurality of second sub-marks may include (2-1)st sub-marks and (2-2)nd sub-marks located in different rows.

According to some embodiments, the (1-1)st sub-marks and the (2-1)st sub-marks may each include an odd number, and the (1-2)nd sub-marks and the (2-2)nd sub-marks may each include an even number.

According to some embodiments, the (1-1)st sub-marks and the (2-1)st sub-marks may be arranged in a same row, and the (1-2)nd sub-marks and the (2-2)nd sub-marks may be arranged in a same row.

According to some embodiments, the first connection group may include a (1-1)st connection group including (1-1)st connection lines in the plurality of first connection lines and a (1-2)nd connection group including (1-2)nd connection lines in the plurality of first connection lines, the second connection group may include a (2-1)st connection group including (2-1)st connection lines in the plurality of second connection lines and a (2-2)nd connection group including (2-2)nd connection lines in the plurality of second connection lines, the first main mark may be located on one side of the (1-1)st connection group, the second main mark may be located between the (1-2)nd connection group and the (2-1)st connection group, the display apparatus may further include a third main mark located between the (1-1)st connection group and the (1-2)nd connection group, and a fourth main mark located between the (2-1)st connection group and the (2-2)nd connection group, the plurality of first connection lines of the first connection group may be numbered based on the first main mark, the third main mark, and the plurality of first sub-marks, and the plurality of second connection lines of the second connection group may be numbered based on the second main mark, the fourth main mark, and the plurality of second sub-marks.

According to some embodiments, the plurality of first sub-marks may include (1-1)st sub-marks and (1-2)nd sub-marks arranged in different rows, the plurality of second sub-marks may include (2-1)st sub-marks and (2-2)nd sub-marks arranged in different rows, the (1-1)st sub-marks and the (2-1)st sub-marks may be arranged in a same row, the (1-2)nd sub-marks and the (2-2)nd sub-marks may be arranged in a same row, the (1-1)st sub-marks and the (2-1)st sub-marks may each include an odd number, and the (1-2)nd sub-marks and the (2-2)nd sub-marks may each include an even number.

According to some embodiments, the (1-1)st connection group may include a (1-1)st convex portion, a (2-1)st convex portion, and a (1-1)st concave portion between the (1-1)st convex portion and the (2-1)st convex portion, the (1-2)nd connection group may include a (1-2)nd convex portion, a (2-2)nd convex portion, and a (1-2)nd concave portion between the (1-2)nd convex portion and the (2-2)nd convex portion, the (2-1)st connection group may include a (3-1)st convex portion, a (4-1)st convex portion, and a (2-1)st concave portion between the (3-1)st convex portion and the (4-1)st convex portion, the (2-2)nd connection group may include a (3-2)nd convex portion, a (4-2)nd convex portion, and a (2-2)nd concave portion between the (3-2)nd convex portion and the (4-2)nd convex portion, the first main mark may be located on one side of the (1-1)st concave portion of the (1-1)st connection group, the second main mark may be located between the (1-2)nd concave portion of the (1-2)nd connection group and the (2-1)st concave portion of the (2-1)st connection group, the third main mark may be located between the (1-1)st concave portion of the (1-1)st connection group and the (1-2)nd concave portion of the (1-2)nd connection group, the fourth main mark may be located between the (2-1)st concave portion of the (2-1)st connection group and the (2-2)nd concave portion of the (2-2)nd connection group, some of the (1-1)st sub-marks may be located in the (1-1)st convex portion of the (1-1)st connection group, others of the (1-1)st sub-marks may be located in the (1-2)nd convex portion of the (1-2)nd connection group, some of the (1-2)nd sub-marks may be located in the (2-1)st convex portion of the (1-1)st connection group, others of the (1-2)nd sub-marks may be located in the (2-2)nd convex portion of the (1-2)nd connection group, some of the (2-1)st sub-marks may be located in the (3-1)st convex portion of the (2-1)st connection group, others of the (2-1)st sub-marks may be located in the (3-2)nd convex portion of the (2-2)nd connection group, some of the (2-2)nd sub-marks may be located in the (4-1)st convex portion of the (2-1)st connection group, and others of the (2-2)nd sub-marks may be located in the (4-2)nd convex portion of the (2-2)nd connection group.

According to some embodiments, the (1-1)st connection group may include a (1-1)st convex portion, a (2-1)st convex portion, and a (1-1)st concave portion between the (1-1)st convex portion and the (2-1)st convex portion, the (1-2)nd connection group may include a (1-2)nd convex portion, a (2-2)nd convex portion, and a (1-2)nd concave portion between the (1-2)nd convex portion and the (2-2)nd convex portion, the (2-1)st connection group may include a (3-1)st convex portion, a (4-1)st convex portion, and a (2-1)st concave portion between the (3-1)st convex portion and the (4-1)st convex portion, the (2-2)nd connection group may include a (3-2)nd convex portion, a (4-2)nd convex portion, and a (2-2)nd concave portion between the (3-2)nd convex portion and the (4-2)nd convex portion, the first main mark may be located on one side of the (1-1)st concave portion of the (1-1)st connection group, the second main mark may be located between the (1-2)nd concave portion of the (1-2)nd connection group and the (2-1)st concave portion of the (2-1)st connection group, the third main mark may be located between the (1-1)st concave portion of the (1-1)st connection group and the (1-2)nd concave portion of the (1-2)nd connection group, the fourth main mark may be located between the (2-1)st concave portion of the (2-1)st connection group and the (2-2)nd concave portion of the (2-2)nd connection group, the plurality of first sub-marks may be located in the (1-1)st convex portion of the (1-1)st connection group and the (1-2)nd convex portion of the (1-2)nd connection group, or located in the (2-1)st convex portion of the (1-1)st connection group and the (2-2)nd convex portion of the (1-2)nd connection group, and the plurality of second sub-marks may be located in the (3-1)st convex portion of the (2-1)st connection group and the (3-2)nd convex portion of the (2-2)nd connection group, or located in the (4-1)st convex portion of the (2-1)st connection group and the (4-2)nd convex portion of the (2-2)nd connection group.

According to some embodiments, the display apparatus may further include a plurality of data lines extending in one direction in the display area, wherein the plurality of first connection lines and the plurality of second connection lines may be electrically connected to the plurality of data lines.

According to one or more embodiments, a display apparatus includes a substrate including a display area and a peripheral area surrounding at least a portion of the display area, a pad portion arranged on one side of the peripheral area, a plurality of connection lines extending from the pad portion to the display area and including at least some of the plurality of connection lines having a zigzag pattern, and first marks and second marks each located between the zigzag patterns of the plurality of connection lines and arranged in different rows.

According to some embodiments, the first marks and the second marks may be arranged in different columns.

According to some embodiments, the plurality of connection lines may include first connection lines and second connection lines alternately arranged, and the first connection lines and the second connection lines may be numbered based on the first marks and the second marks.

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 10 is a schematic enlarged plan view of a portion of a display apparatus according to some embodiments.

DETAILED DESCRIPTION

Figure 1:
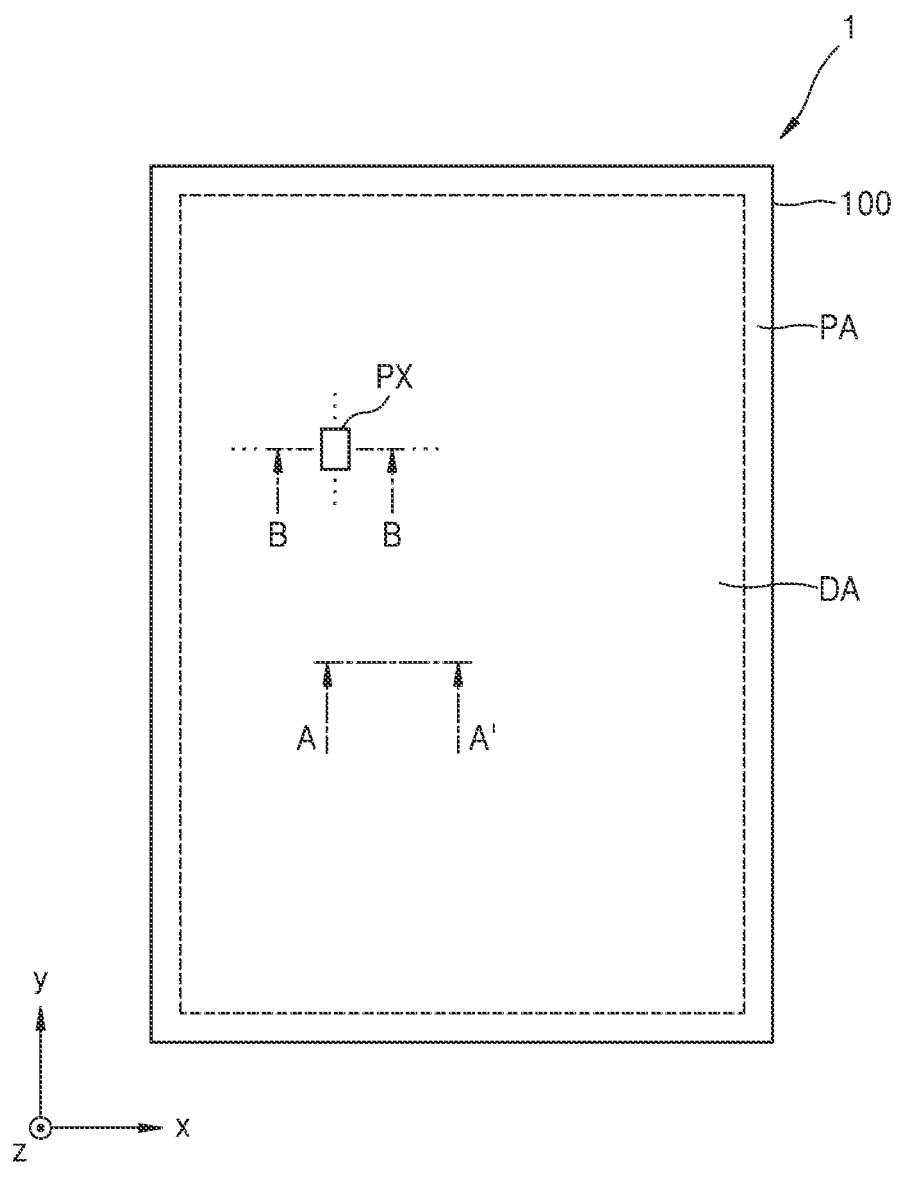
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

In the present specification, "A and/or B" means A or B, or A and B. In the present specification, "at least one of A and B" means A or B, or A and B.

It will be understood that when a layer, region, or element is referred to as being "connected" to another layer, region, or element, it may be "directly connected" to the other layer, region, or element or may be "indirectly connected" to the other layer, region, or element with other layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

FIG. 1 is a schematic plan view of a display apparatus 1 according to some embodiments.

Referring to FIG. 1, the display apparatus 1 includes a display area DA and a peripheral area PA, wherein the display area DA is configured to display images, and the peripheral area PA surrounds at least a portion of the display area DA. The display apparatus 1 may display images to the outside by using light emitted from the display area DA. Because the display apparatus 1 includes a substrate 100, it may be understood that the substrate 100 includes the display area DA and the peripheral area PA. In other words, it may be understood that the display area DA and the peripheral area PA are defined in the substrate 100.

The substrate 100 may include various materials such as glass, metal, or plastic. According to some embodiments, the substrate 100 may include a flexible material. Here, the flexible material denotes a material that is relatively easily warped, bendable, foldable, or rollable. The substrate 100 of the flexible material may include ultra-thin glass, metal, or plastic.

As shown in FIG. 1, the display area DA may be rectangular. According to some embodiments, the display area DA may be provided in a polygonal shape such as a triangle, a pentagon, a hexagon, and the like, a circular shape, an elliptical shape, an irregular shape, or the like.

Pixels PX including various display elements such as an organic light-emitting diode OLED may be arranged in the display area DA of the substrate 100. The pixel PX may be provided in a plurality. The plurality of pixels PX may be arranged in various configurations such as a stripe configuration, a pentile configuration, a mosaic configuration, and the like to display images. Hereinafter, in the present specification, each pixel PX denotes a sub-pixel configured to emit light of a different color. Each pixel PX may be, for example, one of a red sub-pixel, a green sub-pixel, and a blue sub-pixel.

Although an organic light-emitting display apparatus is described as an example of the display apparatus according to some embodiments, the display apparatus according to some embodiments is not limited thereto. According to some embodiments, the display apparatus according to some embodiments may be an inorganic light-emitting display apparatus or a quantum-dot light-emitting display apparatus. As an example, an emission layer of a display element of a display apparatus may include an organic material, an inorganic material, quantum dots, an organic material and quantum dots, an inorganic material and quantum dots, or an organic material, an inorganic material, and quantum dots.

The peripheral area PA of the substrate 100 is a region arranged around the display area DA and may be a region in which images are not displayed. Pads may be arranged in the peripheral area PA, wherein various wirings, a printed circuit board or a driver integrated circuit (IC) chip configured to transfer electric signals to the display area DA are attached to the pads.

Figure 2:
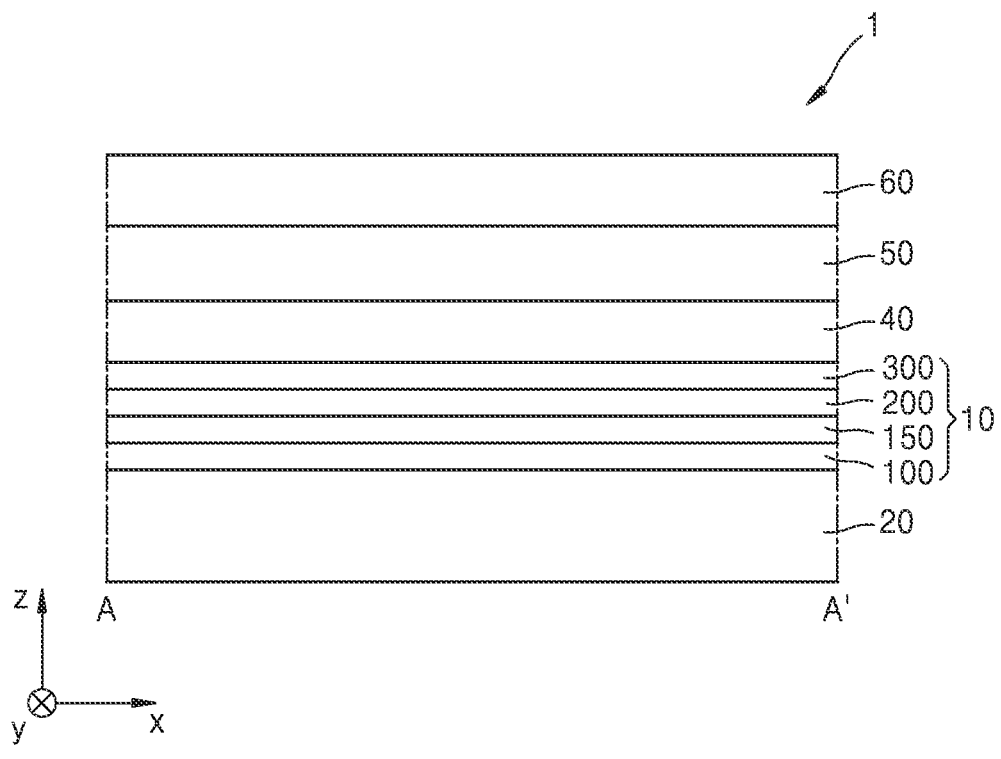
FIG. 2 is a cross-sectional view of an example of a portion of the display apparatus in FIG. 1, taken along the line A-A' in FIG. 1.

FIG. 2 is a cross-sectional view of an example of a portion of the display apparatus in FIG. 1, taken along the line A-A' in FIG. 1.

Referring to FIG. 2, the display apparatus 1 may include a display panel 10, a lower protective film 20, a touch-sensing layer 40, an optical functional layer 50, and a cover window 60.

The display panel 10 may include the substrate 100, a circuit layer 150, a display layer 200, and an encapsulation layer 300, wherein the circuit layer 150 is on the substrate 100, the display layer 200 is on the circuit layer 150, and the encapsulation layer 300 is on the display layer 200.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer that includes the polymer resin and an inorganic layer.

The circuit layer 150 may include at least one transistor (e.g., a thin-film transistor), at least one capacitor, and an insulating layer. The display layer 200 may include an organic light-emitting diode OLED which is a display element. At least one transistor and a display element may constitute a pixel PX (see FIG. 1) and may be electrically connected to each other.

The encapsulation layer 300 may cover the display layer 200. According to some embodiments, the encapsulation layer 300 may include at least one inorganic encapsulation layer and/or at least one organic encapsulation layer. The at least one inorganic encapsulation layer may include at least one inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and be formed by chemical vapor deposition (CVD). Zinc oxide ($ZnO_x$) may be zinc oxide (ZnO) and/or zinc peroxide ($ZnO_2$). The organic encapsulation layer may include a polymer-based material. The polymer-based material may include a silicon-based resin, an acryl-based resin, an epoxy-based resin, polyimide, and polyethylene.

Although it is shown in FIG. 2 that the display layer 200 is covered by the encapsulation layer 330, the display layer 200 may be encapsulated by an encapsulation substrate according to some embodiments.

The lower protective film 20 may be located under (e.g., a −z direction) the display panel 10. The lower protective film 20 may be attached to the rear surface of the substrate 100. An adhesive layer may be located between the lower protective film 20 and the substrate 100. Alternatively, the lower protective film 20 may be directly formed on the rear surface of the substrate 100. In this case, an adhesive layer may not be located between the lower protective film 20 and the substrate 100.

The lower protective film 20 may be configured to support and protect the substrate 100. The lower protective film 20 may include polyethyleneterephthalate (PET) or polyimide (PI).

The touch-sensing layer 40 may be located on the encapsulation layer 300. Alternatively, the touch-sensing layer 40 may be formed separately, and then attached to the encapsulation layer 300 through an adhesive layer such as an optically clear adhesive (OCA). According to some embodiments, as shown in FIG. 2, the touch-sensing layer 40 may be directly formed on the encapsulation layer 300. In this case, the adhesive layer may not be located between the touch-sensing layer 40 and the encapsulation layer 300.

The touch-sensing layer 40 may be configured to obtain coordinate information corresponding to an external input, for example, a touch event. The touch-sensing layer 40 may include a sensing electrode and signal lines connected to the sensing electrode. The touch-sensing layer 40 may sense an external input by using a self-capacitance method or a mutual capacitance method.

The optical functional layer 50 may be formed on the touch-sensing layer 40. The optical functional layer 50 may include an anti-reflection layer. The anti-reflection layer may reduce reflectivity of light (external light) incident toward the display panel 10 from the outside.

According to some embodiments, the optical functional layer 50 may be a polarizing film.

According to some embodiments, the optical functional layer 50 may be a filter plate including a black matrix and color filters.

The cover window 60 may be located on the optical functional layer 50. The cover window 60 may be configured to protect the display panel 10.

The cover window 60 may be a flexible window. The cover window 60 may be configured to protect the display panel 10 while easily bending according to external force without occurrence of cracks and the like. The cover window 60 may include glass, sapphire, or plastic. As an example, the cover window 60 may be, for example, ultrathin glass (UTG®) or colorless polyimide (CPI). According to some embodiments, the cover window 60 may have a structure in which a flexible polymer layer is located on one surface of a glass substrate, or include only a polymer layer.

Figure 3:
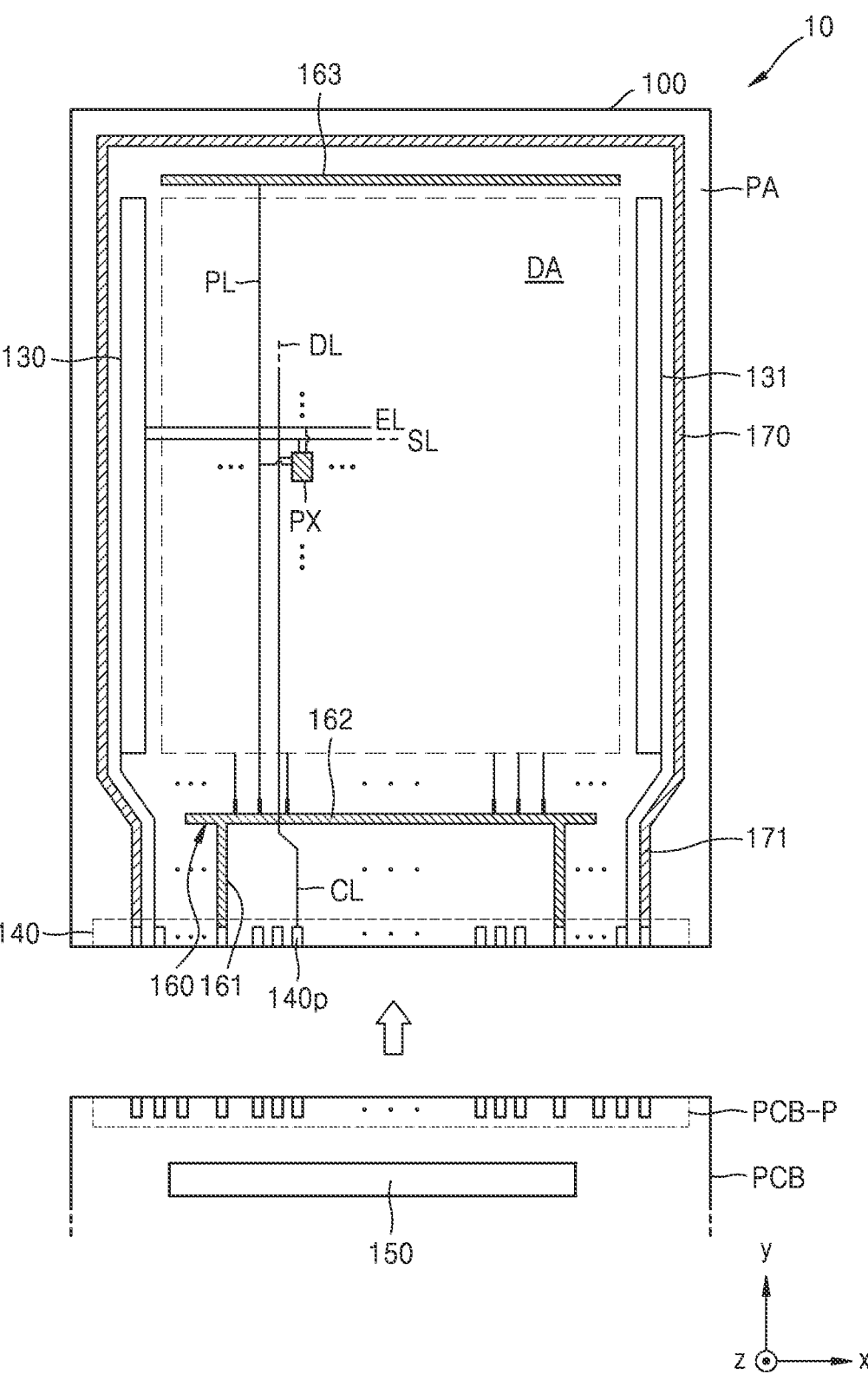
FIG. 3 is a schematic plan view of a display apparatus according to some embodiments.

FIG. 3 is a schematic plan view of the display apparatus 1 according to some embodiments.

Referring to FIG. 3, the display apparatus 1 (see FIG. 1) may include the display panel 10, a printed circuit board PCB, and a data driving circuit 150.

The substrate 100 may include the display area DA and the peripheral area PA surrounding at least a portion of the display area DA. The display area DA may be protected from external air, moisture, or the like by being covered by an encapsulation member.

The display panel 10 may include a plurality of pixels PX, a plurality of scan lines SL, a plurality of emission control lines EL, a plurality of data lines DL, and a plurality of power lines PL arranged in the display area DA.

Each of the sub-pixels PX may include a display element such as an organic light-emitting diode OLED. Each pixel PX may be configured to emit, for example, red, green, blue, or white light from the organic light-emitting diode OLED. Hereinafter, in the present specification, each pixel PX denotes a sub-pixel configured to emit light of a different color. Each pixel PX may be, for example, one of a red sub-pixel, a green sub-pixel, and a blue sub-pixel.

The scan lines SL may each extend in a first direction (e.g., a ±x direction) and be connected to the pixels PX arranged in the same row among the plurality of pixels PX. The scan lines SL may be arranged in a second direction (e.g., a ±y direction). Although it is shown in FIG. 3 that the scan line SL is one line, the scan line SL may include a plurality of lines according to some embodiments.

The emission control lines EL may each extend in the first direction (e.g., the ±x direction) and be connected to the pixels PX arranged in the same row among the plurality of pixels PX. The emission control lines EL may be arranged in the second direction (e.g., the ±y direction). Although it is shown in FIG. 3 that the emission control line EL is one line, the emission control line EL may include a plurality of lines according to some embodiments.

The data lines DL may each extend in the second direction (e.g., the ±y direction) and be connected to the pixels PX arranged in the same column among the plurality of pixels PX. The data lines DL may be arranged in the first direction (e.g., the ±x direction).

The power lines PL may each extend in the second direction (e.g., the ±y direction) and be connected to the pixels PX arranged in the same column among the plurality of pixels PX. The power lines PL may be arranged in the first direction (e.g., the ±x direction).

The display panel 10 may include a first gate driving circuit 130, a second gate driving circuit 131, a first voltage supply line 160, a second voltage supply line 170, and a pad portion 140 arranged in the peripheral area PA. Each pixel PX may be electrically connected to outer circuits arranged in the peripheral area PA.

The first gate driving circuit 130 and the second gate driving circuit 131 may each include a scan driving circuit and an emission control driving circuit. The scan driving circuit may be configured to provide scan signals to each pixel PX through the scan line SL. The emission driving circuit may be configured to provide emission control signals to each pixel PX through the emission control line EL.

The second gate driving circuit 131 may be arranged in parallel to the first gate driving circuit 130 with the display area DA therebetween. Some of the pixels PX arranged in the display area DA may be electrically connected to the first gate driving circuit 130, and the others may be connected to the second gate driving circuit 131. According to some embodiments, the second gate driving circuit 131 may be omitted.

The first voltage supply line 160 may include a first sub-line 162 and a second sub-line 163 extending parallel to each other in the first direction (e.g., the ±x direction) with the display area DA therebetween. The second voltage supply line 170 may have a loop shape having one open side to partially surround the display area DA.

The pad portion 140 may be arranged on one side of the peripheral area PA. The pad portion 140 may include a plurality of pads 140p. The pad portion 140 may be exposed by not being covered by an insulating layer and electrically connected to the printed circuit board PCB. The pads 140p of the pad portion 140 may be electrically connected to a terminal portion PCB-P of the printed circuit board PCB. The printed circuit board PCB is configured to transfer signals or power of a controller to the display panel 10.

Control signals generated by the controller may be respectively transferred to the first gate driving circuit 130 and the second gate driving circuit 131 through the printed circuit board PCB and the pad portion 140.

A first driving voltage generated by the controller may be transferred to the first voltage supply line 160 through a first connection wiring 161 connected to the pad 140p of the pad portion 140. The first driving voltage may be provided to each pixel PX through the power line PL connected to the first voltage supply line 160.

A second driving voltage generated by the controller may be transferred to the second voltage supply line 170 through a second connection wiring 171 connected to the pad 140*p* of the pad portion 140. The second driving voltage may be provided to a cathode (or an opposite electrode) of a display element connected to the second voltage supply line 170.

The data driving circuit 150 may be electrically connected to the data lines DL. A data signal (or a data voltage) of the data driving circuit 150 may be provided to each pixel PX through a connection line CL and the data line DL, wherein the connection line CL is connected to the pad 140*p* of the pad portion 140, and the data line DL is connected to the connection line CL.

Although it is shown in FIG. 3 that the data driving circuit 150 is located on the printed circuit board PCB, the data driving circuit 150 may be located on the substrate 100 according to some embodiments. As an example, the data driving circuit 150 may be arranged between the pad portion 140 and the first voltage supply line 160.

Figure 4:
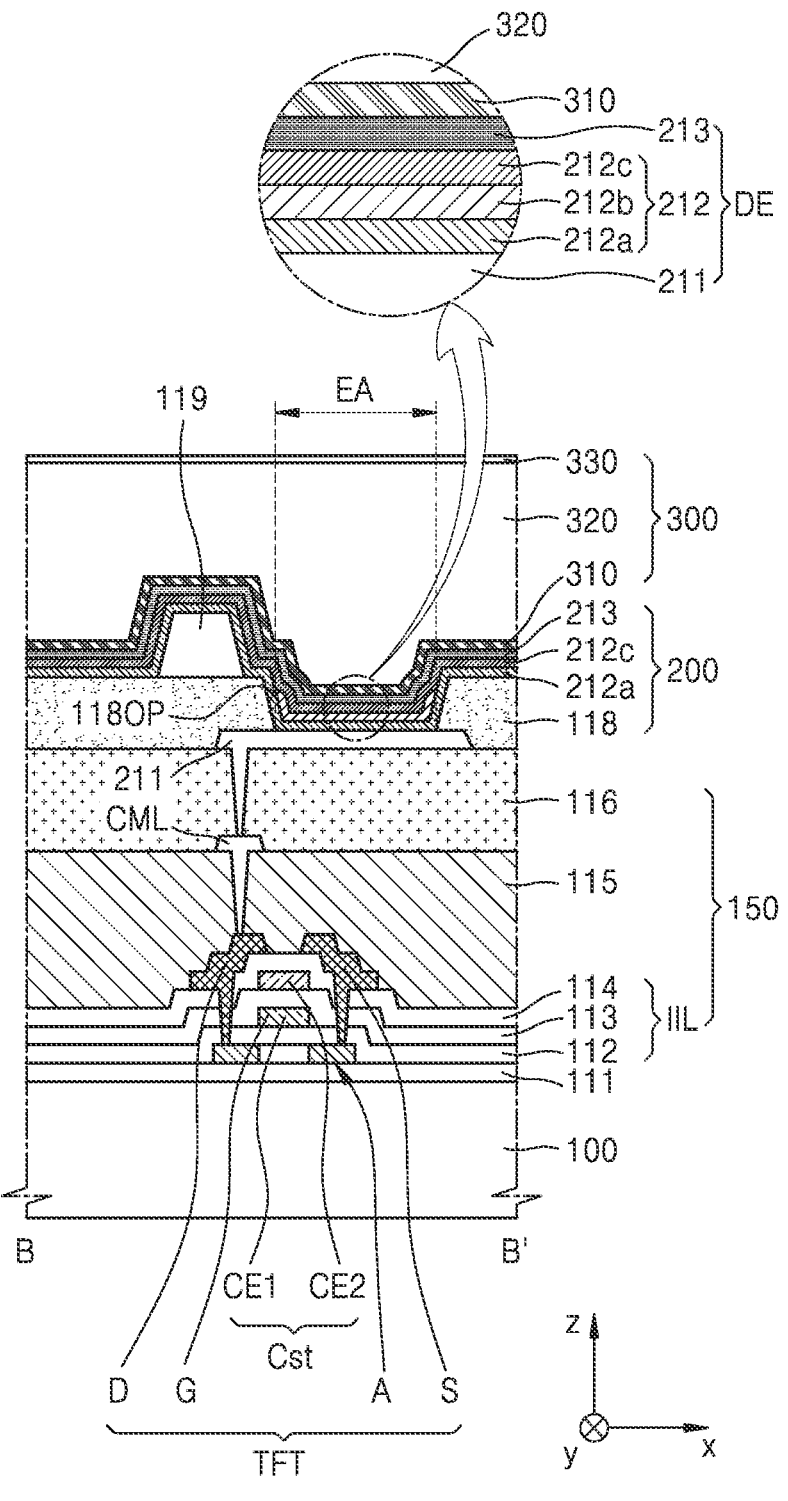
FIG. 4 is a cross-sectional view of an example of a portion of the display apparatus in FIG. 1, taken along the line B-B' in FIG. 1.

FIG. 4 is a cross-sectional view of an example of a portion of the display apparatus 1 of FIG. 1, taken along the line B-B' in FIG. 1. For example, FIG. 4 shows a cross-section of a pixel in the display apparatus 1, and some members may be omitted. Hereinafter, a multi-layer stacked on the display apparatus 1 is described in detail with reference to FIG. 4.

Referring to FIG. 4, the display apparatus 1 (see FIG. 1) may include the substrate 100, a buffer layer 111, the circuit layer 150, the display layer 200, and the encapsulation layer 300.

The substrate 100 may include glass or polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and the like. The substrate 100 including the polymer resin is flexible, rollable, or bendable. The substrate 100 may have a multi-layered structure including a base layer that includes the polymer resin and a barrier layer.

The buffer layer 111 may include an inorganic insulating material such as silicon nitride, silicon oxynitride, and silicon oxide, and may include a single layer or a multi-layer including the above inorganic insulating materials.

The circuit layer 150 may be located on the buffer layer 111. The circuit layer 150 may include a thin-film transistor TFT, an inorganic insulating layer IIL, a first planarization layer 115, and a second planarization layer 116, wherein the thin-film transistor TFT is included in a pixel circuit, and the inorganic insulating layer IIL, the first planarization layer 115, and the second planarization layer 116 are located under and/or on elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polycrystalline silicon. Alternatively, the semiconductor layer A may include amorphous silicon, an oxide semiconductor, or an organic semiconductor. The semiconductor layer A may include a channel region, a drain region, and a source region, the drain region and the source region being respectively on two opposite sides of the channel region. A gate electrode G may overlap the channel region.

The gate electrode G may include a low-resistance conductive or metal material. The gate electrode G may include a conductive material including molybdenum (Mo), aluminum (Al), copper (Cu), and titanium (Ti) and have a single-layered structure or a multi-layered structure including the above materials.

The first gate insulating layer 112 between the semiconductor layer A and the gate electrode G may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode G. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode CE2 of a storage capacitor Cst may be arranged on the second gate insulating layer 113. The upper electrode CE2 may overlap the gate electrode G therebelow. In this case, the gate electrode G and the upper electrode CE2 overlapping each other with the second gate insulating layer 113 therebetween may constitute the storage capacitor Cst. That is, the gate electrode G may serve as a lower electrode CE1 of the storage capacitor Cst. As described above, the storage capacitor Cst may overlap the thin-film transistor TFT. According to some embodiments, the storage capacitor Cst may be formed not to overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the inorganic insulating material.

A drain electrode D and a source electrode S may each be located on the interlayer insulating layer 114. The drain electrode D and the source electrode S may each include a material having high conductivity. The drain electrode D and the source electrode S may each include a conductive material including molybdenum (Mo), aluminum (Al), copper (Cu), and titanium (Ti) and include a single layer or a multi-layer including the above materials. According to some embodiments, the drain electrode D and the source electrode S may each have a multi-layered structure of Ti/Al/Ti.

The first planarization layer 115 may cover the drain electrode D and the source electrode S. The first planarization layer 115 may include an organic insulating material. The first planarization layer 115 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CML may be located on the first planarization layer 115. In this case, the connection electrode CML may be connected to the drain electrode D or the source electrode S through a contact hole of the first planarization layer 115. The connection electrode CML may include a material having a high conductivity. The connection electrode CML may include a conductive material including molybdenum (Mo), aluminum (Al), copper (Cu), and titanium (Ti) and have a single-layered structure or a multi-layered structure including the above materials. According to some embodiments, the connection electrode CML may have a multi-layered structure of Ti/Al/Ti.

The second planarization layer 116 may cover the connection electrode CML. The second planarization layer 116 may include an organic insulating material. The second planarization layer 116 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display layer 200 may be located on the circuit layer 150. The display layer 200 may include a display element DE. The display element DE may be an organic light-emitting diode OLED. The display element DE may include a pixel electrode 211, an intermediate layer 212, and an opposite electrode 213.

The pixel electrode 211 of the display element DE may be electrically connected to the connection electrode CML through a contact hole in the second planarization layer 116. The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. According to some embodiments, the pixel electrode 211 may further include a layer on/under the reflective layer, the layer including ITO, IZO, ZnO, or $In_2O_3$.

A pixel-defining layer 118 may be located on the pixel electrode 211, wherein the pixel-defining layer 118 includes an opening 118OP exposing a central portion of the pixel electrode 211. The pixel-defining layer 118 may include an organic insulating material and/or an inorganic insulating material. The opening 118OP may define an emission area EA of light emitted from the display element DE. As an example, the width of the opening 118OP may correspond to the width of the emission area EA of the display element DE.

A spacer 119 may be located on the pixel-defining layer 118. The spacer 119 may be designed to prevent destruction of the substrate 100 in a method of manufacturing a display apparatus. When the display panel is manufactured, a mask sheet may be used. In this case, the mask sheet may enter the inside of the opening 118OP of the pixel-defining layer 118 or be closely attached to the pixel-defining layer 118. The spacer 119 may prevent a portion of the substrate 100 from being damaged or destroyed by the mask sheet while a deposition material is deposited on the substrate 100.

The spacer 119 may include an organic insulating material such as polyimide. Alternatively, the spacer 119 may include an inorganic insulating material such as silicon nitride or silicon oxide, or include an organic insulating material and an inorganic insulating material.

According to some embodiments, the spacer 119 may include a different material from a material of the pixel-defining layer 118. Alternatively, according to some embodiments, the spacer 119 may include the same material as a material of the pixel-defining layer 118. In this case, the pixel-defining layer 118 and the spacer 119 may be formed together during a mask process that uses a half-tone mask and the like.

The intermediate layer 212 may be located on the pixel-defining layer 118. The intermediate layer 212 may include an emission layer 212b located in the opening 118OP of the pixel-defining layer 118. The emission layer 212b may include a polymer organic material or a low-molecular weight organic material emitting light having a preset color.

A first functional layer 212a and a second functional layer 212c may be respectively arranged under and on the emission layer 212b. The first functional layer 212a may include, for example, a hole transport layer (HTL), or include an HTL and a hole injection layer (HIL). The second functional layer 212c is an element located on the emission layer 212b and may be optional. The second functional layer 212c may include an electron transport layer (ETL) and/or an electron injection layer (EIL). Like the opposite electrode 213 described below, the first functional layer 212a and/or the second functional layer 212c may be common layers covering the substrate 100 entirely.

The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the opposite electrode 213 may further include a layer on the (semi) transparent layer, the layer including ITO, IZO, ZnO, or $In_2O_3$.

According to some embodiments, a capping layer may be further arranged on the opposite electrode 213. The capping layer may include lithium fluoride (LiF), an inorganic material, and/or an organic material.

The encapsulation layer 300 may be located on the opposite electrode 213. The encapsulation layer 300 may include at least one inorganic encapsulation layer and at least one organic encapsulation layer. It is shown in FIG. 4 that the encapsulation layer 300 includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. According to some embodiments, the organic encapsulation layer 320 may include acrylate.

According to some embodiments, as described above with reference to FIG. 2, the touch-sensing layer 40 may be located on the encapsulation layer 300, and the optical functional layer 50 may be located on the touch-sensing layer 40. The touch-sensing layer 40 may be configured to obtain coordinate information corresponding to an external input, for example, a touch event. The optical functional layer 50 may reduce the reflectivity of light (external light) incident toward the display apparatus 1 from outside, and/or improve the color purity of light emitted from the display apparatus 1. According to some embodiments, the optical functional layer 50 may include a retarder and/or a polarizer.

The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged, for example, in a set or predetermined arrangement. Each of the retarder and the polarizer may further include a protective film.

According to some embodiments, optical functional layer 50 may include a black matrix and color filters. The color filters may be arranged by taking into account colors of pieces of light emitted respectively from the pixels PX of the display apparatus 1. The color filters may each include red, green, or blue pigment or dye. Alternatively, the color filters may each further include quantum dots in addition to the pigment or dye. Alternatively, some of the color filters may not include pigment or dye, and may include scattering particles such as titanium oxide.

According to some embodiments, the optical functional layer 50 may include a destructive interference structure. The destructive interference structure may include a first reflection layer and a second reflection layer respectively arranged on different layers. First-reflected light and second-reflected light respectively reflected by the first reflection layer and the second reflection layer may destructively interfere, and thus, the reflectivity of external light may be reduced.

An adhesive member may be located between the touch-sensing layer 40 and the optical functional layer 50. For the adhesive member, a general adhesive member known in the art may be employed without limitation. The adhesive member may be a pressure sensitive adhesive (PSA).

Figure 5:
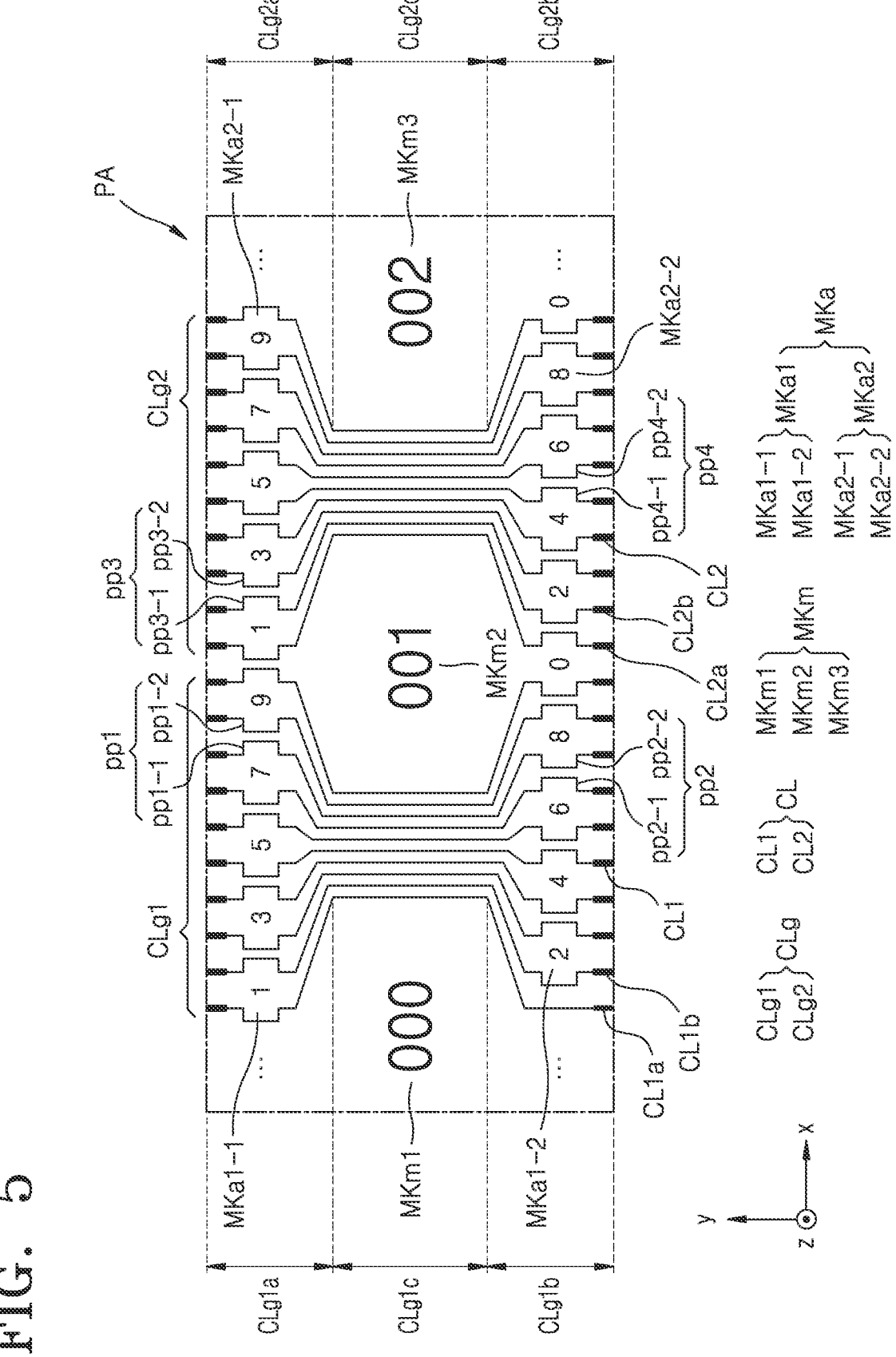
FIG. 5 is a schematic enlarged plan view of a portion of a display apparatus according to some embodiments.

FIG. 5 is a schematic enlarged plan view of a portion of the display apparatus 1 according to some embodiments. For example, FIG. 5 is a schematic enlarged plan view of a portion of the peripheral area of the display apparatus 1 according to some embodiments.

Referring to FIG. 5, the display apparatus 1 (see FIG. 1) may include connection groups CLg, main marks MKm, and sub-marks MKa arranged in the peripheral area PA.

The connection groups CLg may be arranged in the first direction (e.g., the ±x direction). The connection groups CLg may each include connection lines CL. As an example, a first connection group CLg1 may be adjacent to a second connection group CLg2. The first connection group CLg1 may include first connection lines CL1, and the second connection group CLg2 may include second connection lines CL2.

As described above with reference to FIG. 3, the connection lines CL may extend from the pad portion 140 to the display area DA. The connection lines CL may be electrically connected to the data lines DL. As an example, the first connection lines CL1 and the second connection lines CL2 may extend from the pad portion 140 to the display area DA and be electrically connected to the data lines DL.

Although it is shown in FIG. 5 that ten connection lines Cl constitute one connection group CLg, one connection group CLg may include twenty connection lines CL according to some embodiments. According to some embodiments, one connection group CLg may include five connection lines CL.

The connection groups CLg may each include convex portions and concave portions between the convex portions. As an example, the first connection group CLg1 may include a first convex portion CLg1a, a second convex portion CLg1b, and a first concave portion CLg1c between the first convex portion CLg1a and the second convex portion CLg1b. The second connection group CLg2 may include a third convex portion CLg2a, a fourth convex portion CLg2b, and a second concave portion CLg2c between the third convex portion CLg2a and the fourth convex portion CLg2b.

The main marks MKm may be located between the connection groups CLg. As an example, a first main mark MKm1 may be located on one side of the first connection group CLg1. A second main mark MKm2 may be located between the first connection group CLg1 and the second connection group CLg2. The second main mark MKm2 may be located on another side (or one side of the second connection group CLg2) of the first connection group CLg1. A third main mark MKm3 may be located on another side of the second connection group CLg2.

According to some embodiments, the main marks MKm may be located between concave portions of the connection groups CLg. As an example, the first main mark MKm1 may be located on one side of the first concave portion CLg1c of the first connection group CLg1. The second main mark MKm2 may be located between the first concave portion CLg1c of the first connection group CLg1 and the second concave portion CLg2c of the second connection group CLg2. The second main mark MKm2 may be located on another side of the first concave portion CLg1c of the first connection group CLg1 (or on one side of the second concave portion CLg2c of the second connection group CLg2). The third main mark MKm3 may be located on another side of the second concave portion CLg2c of the second connection group CLg2.

The sub-marks MKa may each be located between the connection lines CL of each of the connection group CLg. As an example, first sub-marks MKa1 may each be located between the first connection lines CL1 of the first connection group CLg1. The second sub-marks MKa2 may each be located between the second connection lines CL2 of the second connection group CLg2.

According to some embodiments, some of the sub-marks MKa may be located on one of the convex portions of the connection group CLg, and others of the sub-marks MKa may be located on another of the convex portions of the connection group CLg. As an example, (1-1)st sub-marks MKa1-1 of the plurality of first sub-marks MKa1 may be located on the first convex portion CLg1a of the first connection group CLg1, and (1-2)nd sub-marks MKa1-2 of the plurality of first sub-marks MKa1 may be located on the second convex portion CLg1b of the first connection group CLg1. (2-1)st sub-marks of the plurality of second sub-marks MKa2 may be located in the third convex portion CLg2a of the second connection group CLg2, and (2-2)nd sub-marks of the plurality of second sub-marks MKa2 may be located in the fourth convex portion CLg2b of the second connection group CLg2.

According to some embodiments, some of the connection lines corresponding to the convex portions of the connection group CLg may include protrusions. The protrusions may protrude in the +x direction or −x direction. As an example, some of the first connection lines CL1 corresponding to the first convex portion CLg1a of the first connection group CLg1 may include first protrusions pp1, and others of the first connection lines CL1 corresponding to the second convex portion CLg1b of the first connection group CLg1 may include second protrusions pp2. The first protrusions pp1 may include (1-1)st protrusions pp1-1 protruding in the +x direction and (1-2)nd protrusions pp1-2 protruding in the −x direction. The (1-1)st protrusions pp1-1 and the (1-2)nd protrusions pp1-2 may be alternately arranged. The second protrusions pp2 may include (2-1)st protrusions pp2-1 protruding in the +x direction and (2-2)nd protrusions pp2-2 protruding in the −x direction. The (2-1)st protrusions pp2-1 and the (2-2)nd protrusions pp2-2 may be alternately arranged. Some of the second connection lines CL2 corresponding to the third convex portions CLg2a of the second connection group CLg2 may include third protrusions pp3, and others of the second connection lines CL2 corresponding to the fourth convex portions CLg2b of the second connection group CLg2 may include fourth protrusions pp4. The third protrusions pp3 may include (3-1)st protrusions pp3-1 protruding in the +x direction and (3-2)nd protrusions pp3-2 protruding in the −x direction. The (3-1)st protrusions pp3-1 and the (3-2)nd protrusions pp3-2 may be alternately arranged. The fourth protrusions pp4 may include (4-1)st protrusions pp4-1 protruding in the +x direction and (4-2)nd protrusions pp4-2 protruding in the −x direction. The (4-1)st protrusions pp4-1 and the (4-2)nd protrusions pp4-2 may be alternately arranged.

According to some embodiments, the sub-marks MKa may be located between protrusions of the connection lines CL. As an example, the (1-1)st sub-marks MKa1-1 may each be located between the first protrusions pp1, and the (1-2)nd sub-marks MKa1-2 may each be located between the second protrusions pp2. The (2-1)st sub-marks MKa2-1 may each be located between the third protrusions pp3, and the (2-2)nd sub-marks MKa2-2 may each be located between the fourth protrusions pp4.

According to some embodiments, the connection lines CL may be numbered based on the main marks MKm and the sub-marks MKa. As an example, the first connection lines CL1 of the first connection group CLg1 may be numbered based on the first main mark MKm1 and the first sub-mark MKa1. The second connection line CL2 of the second connection group CLg2 may be numbered based on the second mark MKm2 and the second sub-mark MKa2.

The main mark MKm may be numbered tens digit or more, and the sub-mark MKa may be numbered one digit. As an example, as shown in FIG. 5, the main mark MKm may include three digits and the sub-mark MKa may include one digit. The (1-1)st sub-marks MKa1-1 and the (2-1)st sub-marks MKa2-1 may each include an odd number, and the (1-2)nd sub-marks MKa1-2 and the (2-2)nd sub-marks MKa2-2 may each include an even number. As an example, a first first connection line CL1a may be numbered '0001' and a second first connection line CL1b may be numbered '0002'. A first second connection line CL2a may be numbered '0011' and a second second connection line CL2b may be numbered '0012'.

As described above, when the main marks MKm are located between the connection groups CLg and located in the same row, a possibility that the main marks MKm are displayed on one monitor screen when a display panel is inspected increases. The main mark MKm is more recognizable. In addition, because the sub-marks MKa are located near the main mark MKm, the sub-mark MKa is also more recognizable. When the main mark MKm and the sub-mark MKa are more recognizable, a specific position of the connection lines CL may be easily found and an inspection speed of the display panel may increase.

Although it is shown in FIG. 5 that the main mark MKm includes three digits, the number of digits included in the main mark MKm may vary depending on the numbering of the connecting lines CL. According to some embodiments, the main mark MKm may include a four- or five-digit number. As an example, the second main mark MKm2 may include '0010'. In this case, it becomes more intuitively known to recognize that the second main mark MKm2 numbers more than ten digits.

In addition, although it is shown in FIG. 5 that the main mark MKm and the sub-mark MKa include a number, at least one of the main mark MKm or the sub-mark MKa includes at least one symbol according to some embodiments.

Figure 6:
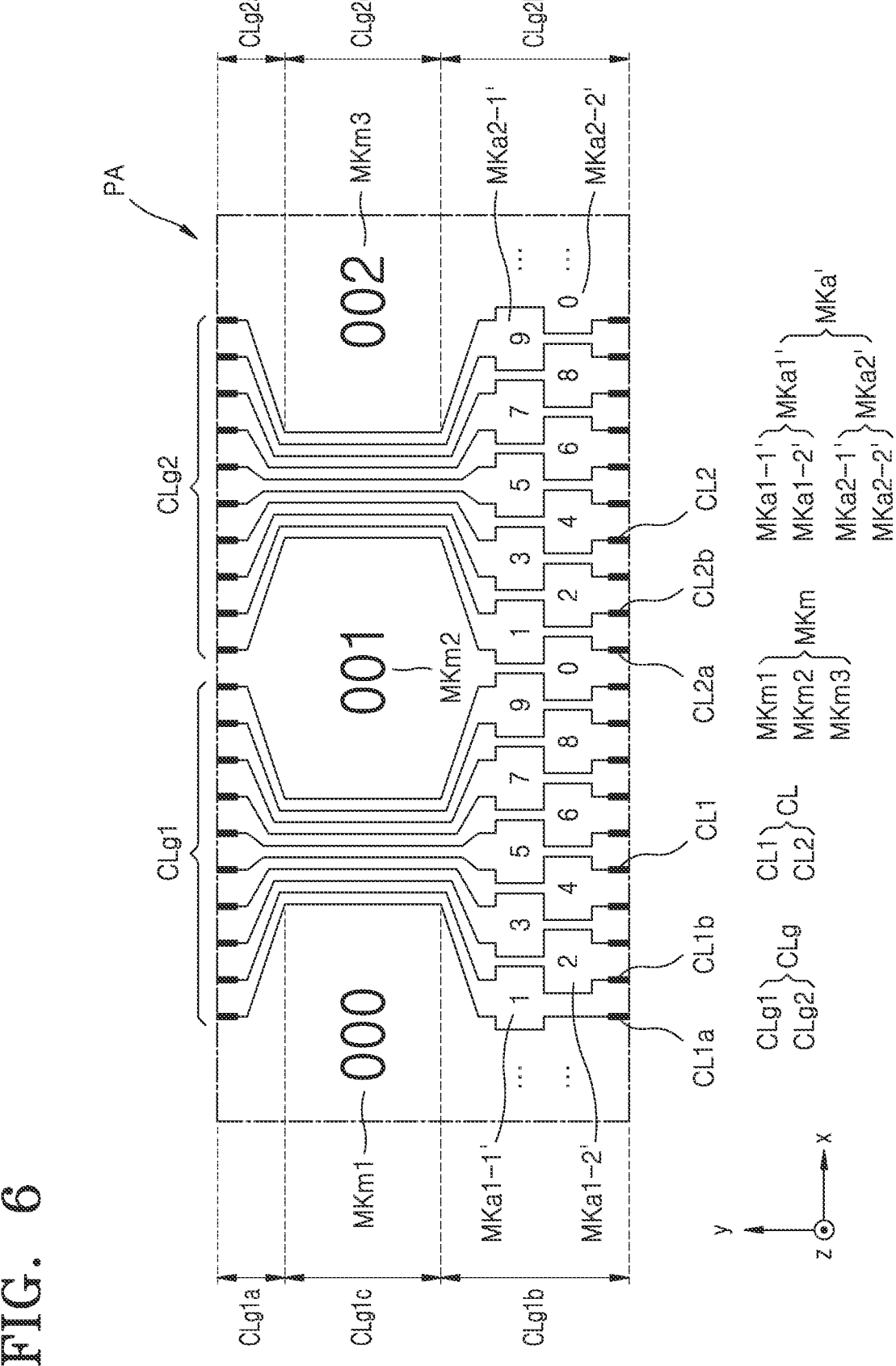
FIG. 6 is a schematic enlarged plan view of a portion of a display apparatus according to some embodiments.

FIG. 6 is a schematic enlarged plan view of a portion of a display apparatus according to some embodiments. FIG. 6 illustrates some modifications to the embodiments illustrated and described with respect to FIG. 5 and is different from FIG. 5 in the structure of the sub-marks. Hereinafter, some repetitive descriptions of the components and characteristics of the embodiments described with respect to FIG. 5 may be omitted, and differences are mainly described.

Referring to FIG. 6, first sub-marks MKa1' among a plurality of sub-marks MKa' may be located in one of the first convex portion CLg1a and the second convex portion CLg1b of the first connection group CLg1. Second sub-marks MKa2' among the plurality of sub-marks MKa' may be located in one of the third convex portion CLg2a and the fourth convex portion CLg2b of the second connection group CLg2. As an example, the first sub-marks MKa1' may be located in the second convex portion CLg1b of the first connection group CLg1, and the second sub-marks MKa2' may be located in the fourth convex portion CLg2b of the second connection group CLg2.

In this case, some of the first connection lines CL1 corresponding to the second convex portion CLg1b of the first connection group CLg1 may have a zigzag pattern. Some of the second connection lines CL2 corresponding to the fourth convex portion CLg2b of the second connection group CLg2 may have a zigzag pattern. The first sub-marks MKa1' may be located between zigzag patterns of the first connection lines CL1, and the second sub-marks MKa2' may be located between zigzag patterns of the second connection lines CL2.

The first sub-marks MKa1' may include (1-1)st sub-marks MKa1-1' and (1-2)nd sub-marks MKa1-2' located in different rows. The second sub-marks MKa2' may include (2-1)st sub-marks MKa2-1' and (2-2)nd sub-marks MKa2-2' located in different rows. The (1-1)st sub-marks MKa1-1' and the (1-2)nd sub-marks MKa1-2' may be located in different columns, and the (2-1)st sub-marks MKa2-1' and the (2-2)nd sub-marks MKa2-2' may be located in different columns. The (1-1)st sub-marks MKa1-1' and the (2-1)st sub-marks MKa2-1' may be located in the same row, and the (1-2)nd sub-marks MKa1-2' and the (2-2)nd sub-marks MKa2-2' may be located in the same row. In this case, the (1-1)st sub-marks MKa1-1' and the (2-1)st sub-marks MKa2-1' may each include an odd number, and the (1-2)nd sub-marks MKa1-2' and the (2-2)nd sub-marks MKa2-2' may each include an even number.

Although it is shown in FIG. 6 that the first sub-marks MKa1' are located in the second convex portion CLg1b of the first connection group CLg1, and the second sub-marks MKa2' are located in the fourth convex portion CLg2b of the second connection group CLg2, the first sub-marks MKa1' may be located in the first convex portion CLg1a of the first connection group CLg1, and the second sub-marks MKa2' may be located in the third convex portion CLg2a of the second connection group CLg2 according to some embodiments. As another example, the first sub-marks MKa1' may be located in the first convex portion CLg1a of the first connection group CLg1, and the second sub-marks MKa2' may be located in the fourth convex portion CLg2b of the second connection group CLg2. As another example, the first sub-marks MKa1' may be located in the second convex portion CLg1*b* of the first connection group CLg1, and the second sub-marks MKa2' may be located in the third convex portion CLg2*a* of the second connection group CLg2.

In addition, although it is shown in FIG. 6 that the first sub-marks MKa1' are located in two different rows, the first sub-marks MKa1' may be located in three or more different rows according to some embodiments. Although description has been made to the first sub-marks MKa1', the description is equally applicable to the second marks MKa2'.

Figure 7:
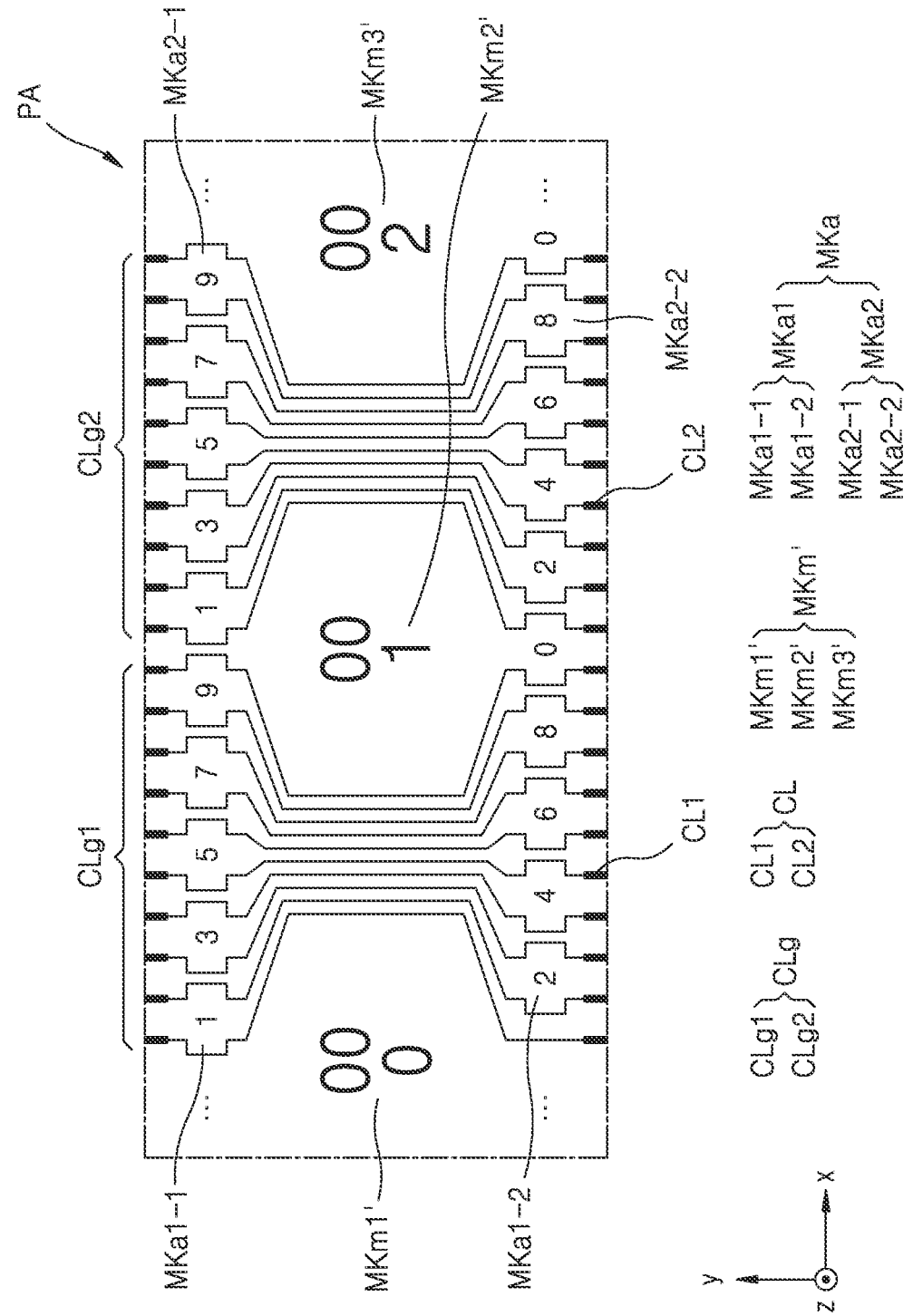
FIG. 7 is a schematic enlarged plan view of a portion of a display apparatus according to some embodiments.

FIG. 7 is a schematic enlarged plan view of a portion of a display apparatus according to some embodiments. FIG. 7 illustrates certain modifications with respect to the embodiments described with respect to FIG. 5 and is different from FIG. 5 in the structure of the main marks. Hereinafter, some repetitive descriptions of the characteristics and features of the embodiments described with respect to FIG. 5 may be omitted, and differences are mainly described.

Referring to FIG. 7, the main marks MKm' may include numbers arranged in two rows. As an example, the first main mark MKm1' may include '00' and '0' located in different rows. The second main mark MKm2' may include '00' and '1' located in different rows. The third main mark MKm3' may include '00' and '2' located in different rows.

Figure 8:
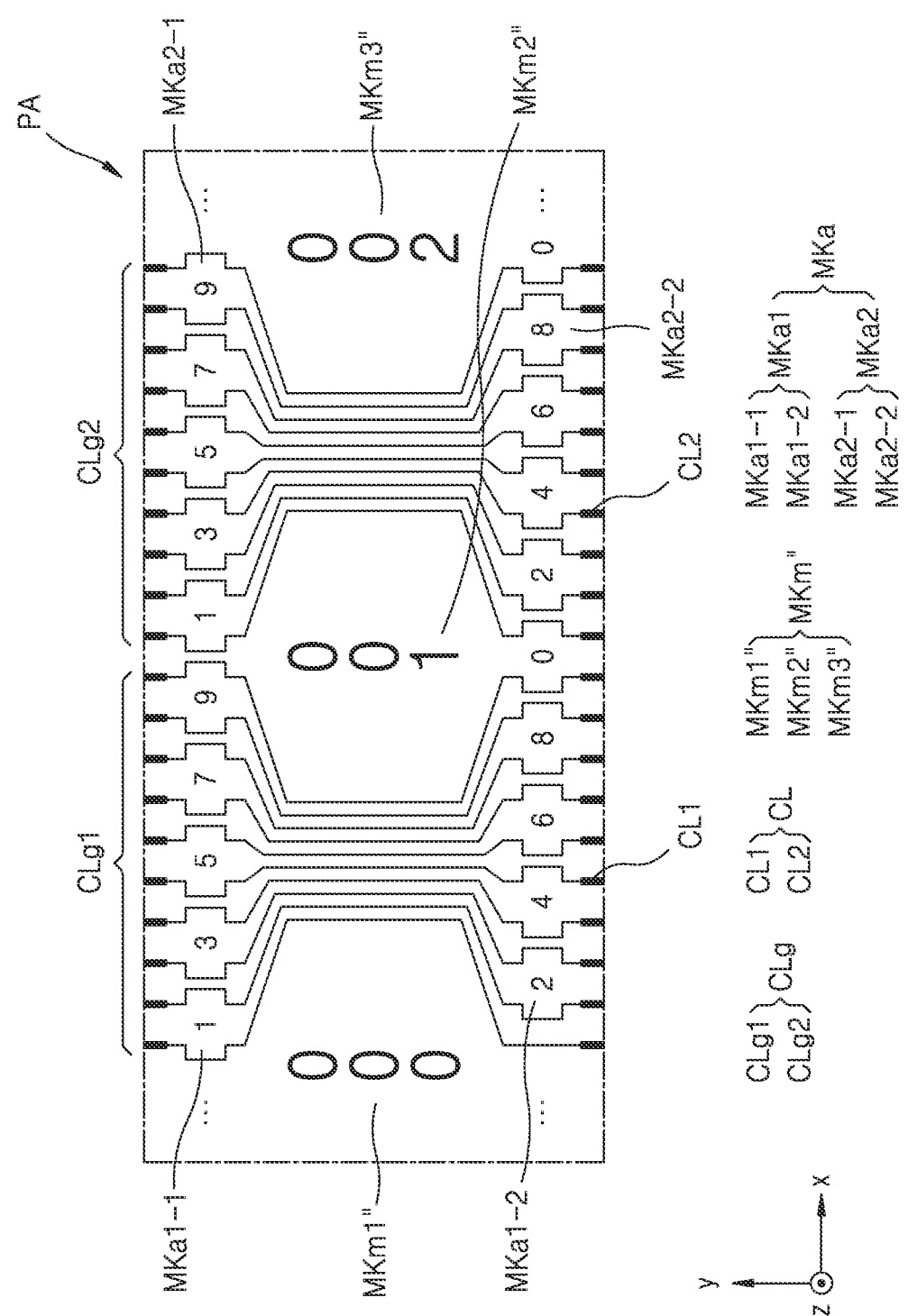
FIG. 8 is a schematic enlarged plan view of a portion of a display apparatus according to some embodiments.

FIG. 8 is a schematic enlarged plan view of a portion of a display apparatus according to some embodiments. FIG. 8 illustrates certain modifications of the embodiments illustrated and described with respect to FIG. 5 and is different from FIG. 5 in the structure of the main marks. Hereinafter, some repetitive descriptions of the characteristics and features of the embodiments described with respect to FIG. 5 may be omitted, and differences are mainly described.

Referring to FIG. 8, main marks MKm" may include numbers arranged in three rows. Alternatively, the main marks MKm" may include numbers arranged vertically. As an example, the first main mark MKm1" may include '000' arranged vertically. The second main mark MKm2" may include '001' arranged vertically. The third main mark MKm3" may include '002' arranged vertically.

Figure 9:
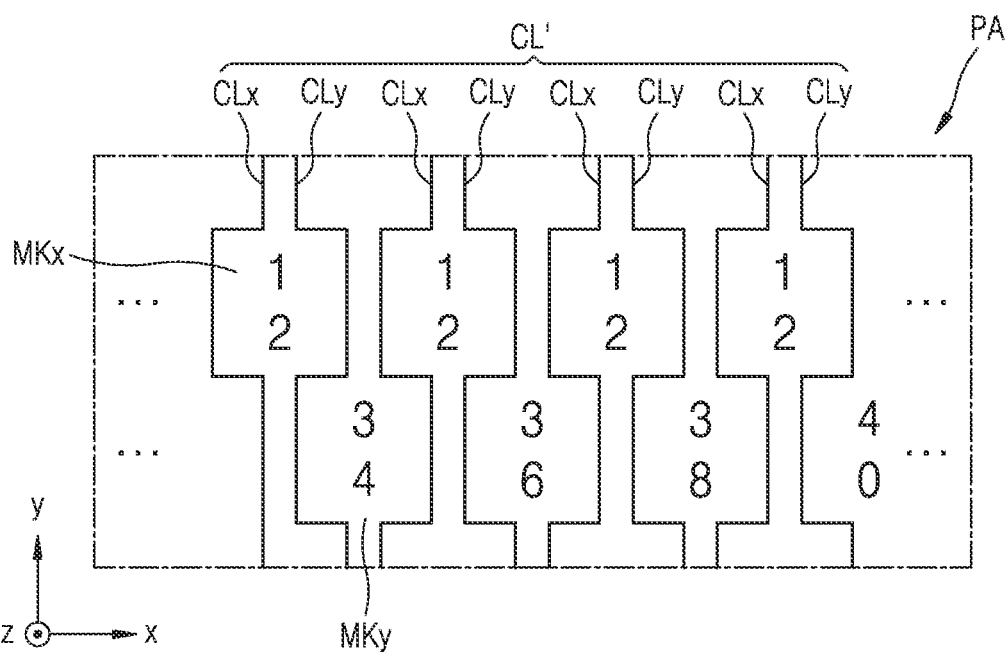
FIG. 9 is a schematic enlarged plan view of a portion of a display apparatus according to some embodiments.

FIG. 9 is a schematic enlarged plan view of a portion of a display apparatus according to some embodiments.

Referring to FIG. 9, the display apparatus 1 (see FIG. 1) may include connection lines CL', first marks MKx, and second marks MKy arranged in the peripheral area PA.

At least a portion of each of the connection lines CL' may have a zigzag pattern. The connection lines CL' may include first connection lines CLx and second connection lines CLy alternately arranged with each other.

As described above with reference to FIG. 3, the connection lines CL' may extend from the pad portion 140 to the display area DA. The connection lines CL' may be electrically connected to the data lines DL. As an example, the first connection lines CLx and the second connection lines CLy may extend from the pad portion 140 to the display area DA and be electrically connected to the data lines DL.

The first marks MKx and the second marks MKy may each be located between zigzag patterns of the connection lines CL'. The first marks MKx and the second marks MKy may be arranged in different rows. The first marks MKx and the second marks MKy may be arranged in different columns.

According to some embodiments, the first connection lines CLx or the second connection lines CLy may be numbered based on the first marks MKx and the second marks MKy. The first mark MKx may be configured to number more than one hundred digits, and the second mark MKy may be configured to number fewer than ten digits.

As an example, as shown in FIG. 9, the first mark MKx may include two digits and the second mark MKy may include two digits. As an example, in the case where the first connection lines CLx are numbered based on the first marks MKx and the second marks MKy, a first first connection line CLx may be numbered '1234', and a second first connection line CLx may be numbered '1236'. As a result, a first second connection line CLy between the first connection lines CLx and the second first connection line CLx may be numbered '1235'.

Figure 10:
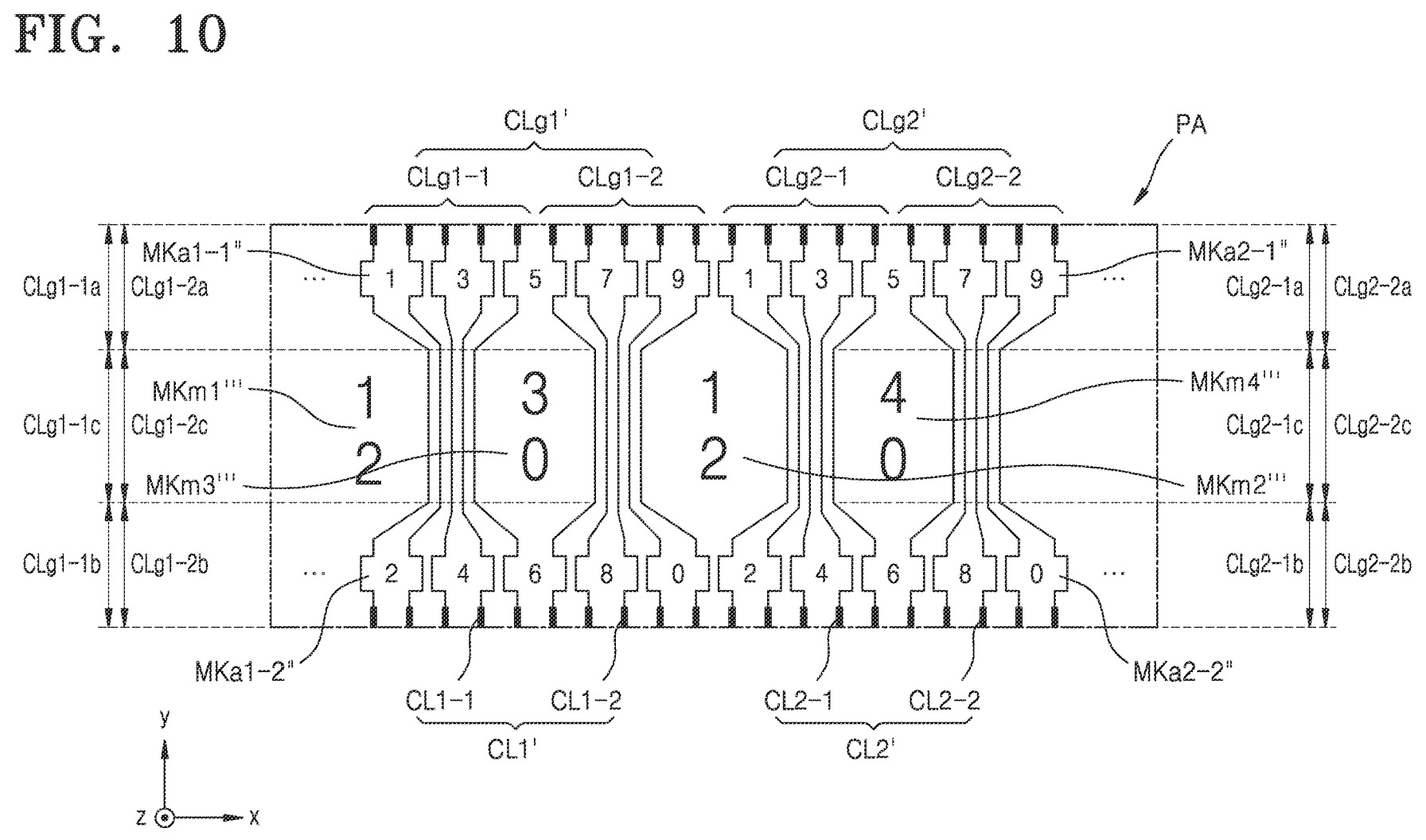

FIG. 10 is a schematic enlarged plan view of a portion of a display apparatus according to some embodiments. FIG. 10 illustrates certain modifications of the embodiments illustrated and described with respect to FIG. 5 and is different from FIG. 5 in the structure of the connection groups. Hereinafter, some repetitive description of the embodiments described with respect to FIG. 5 may be omitted, and differences are mainly described.

Referring to FIG. 10, a first connection group CLg1' may include a (1-1)st connection group CLg1-1 and a (1-2)nd connection group CLg1-2. The (1-1)st connection group CLg1-1 may include (1-1)st connection lines CL1-1 among a plurality of first connection lines CL1', and the (1-2)nd connection group CLg1-2 may include (1-2)nd connection lines CL1-2 among the plurality of first connection lines CL1'. The (1-1)st connection group CLg1-1 may include a (1-1)st convex portion CLg1-1*a*, a (2-1)st convex portion CLg1-1*b*, and a (1-1)st concave portion CLg1-1*c* between the (1-1)st convex portion CLg1-1*a* and the (2-1)st convex portion CLg1-1*b*. The (1-2)nd connection group CLg1-2 may include a (1-2)nd convex portion CLg1-2*a*, a (2-2)nd convex portion CLg1-2*b*, and a (1-2)nd concave portion CLg1-2*c* between the (1-2)nd convex portion CLg1-2*a* and the (2-2)nd convex portion CLg1-2*b*.

A second connection group CLg2' may include a (2-1)st connection group CLg2-1 and a (2-2)nd connection group CLg2-2. The (2-1)st connection group CLg2-1 may include (2-1)st connection lines CL2-1 among a plurality of second connection lines CL2', and the (2-2)nd connection group CLg2-2 may include (2-2)nd connection lines CL2-2 among the plurality of second connection lines CL2'. The (2-1)st connection group CLg2-1 may include a (3-1)st convex portion CLg2-1*a*, a (4-1)st convex portion CLg2-1*b*, and a (2-1)st concave portion CLg2-1*c* between the (3-1)st convex portion CLg2-1*a* and the (4-1)st convex portion CLg2-1*b*. The (2-2)nd connection group CLg2-2 may include a (3-2)nd convex portion CLg2-2*a*, a (4-2)nd convex portion CLg2-2*b*, and a (2-2)nd concave portion CLg2-2*c* between the (3-2)nd convex portion CLg2-2*a* and the (4-2)nd convex portion CLg2-2*b*.

A first main mark MKm1'" may be located on one side of the (1-1)st connection group CLg1-1. The first main mark MKm1'" may be located on one side of the (1-1)st concave portion CLg1-1*c* of the (1-1)st connection group CLg1-1. A second main mark MKm2'" may be located between the (1-2)nd connection group CLg1-2 and the (2-1)st connection group CLg2-1. The second main mark MKm2'" may be located between the (1-2)nd concave portion CLg1-2*c* of the (1-2)nd connection group CLg1-2 and the (2-1)st concave portion CLg2-1*c* of the (2-1)st connection group CLg2-1. A third main mark MKm3'" may be located between the (1-1)nd connection group CLg1-1 and the (1-2)nd connection group CLg1-2. The third main mark MKm3'" may be located between the (1-1)st concave portion CLg1-1*c* of the (1-1)st connection group CLg1-1 and the (1-2)nd concave portion CLg1-2c of the (1-2)nd connection group CLg1-2. A fourth main mark MKm4''' may be located between the (2-1)st connection group CLg2-1 and the (2-2)nd connection group CLg2-2. The fourth main mark MKm4''' may be located between the (2-1)st concave portion CLg2-1c of the (2-1)st connection group CLg2-1 and the (2-2)nd concave portion CLg2-2c of the (2-2)nd connection group CLg2-2.

The (1-1)st sub-marks MKa1-1'' and the (1-2)nd sub-marks MKa1-2'' may be located in different rows, and the (2-1)st sub-marks MKa2-1'' and the (2-2)nd sub-marks MKa2-2'' may be located in different rows. The (1-1)st sub-marks MKa1-1'' and the (2-1)st sub-marks MKa2-1'' may be located in the same row, and the (1-2)nd sub-marks MKa1-2'' and the (2-2)nd sub-marks MKa2-2'' may be located in the same row.

Some of the (1-1)st sub-marks MKa1-1'' may be located in the (1-1)st convex portion CLg1-1a of the (1-1)st connection group CLg1-1, and others of the (1-1)st sub-marks MKa1-1'' may be located in the (1-2)nd convex portion CLg1-2a of the (1-2)nd connection group CLg1-2. Some of the (1-2)nd sub-marks MKa1-2'' may be located in the (2-1)st convex portion CLg1-1b of the (1-1)st connection group CLg1-1, and others of the (1-2)nd sub-marks MKa1-2'' may be located in the (2-2)nd convex portion CLg1-2b of the (1-2)nd connection group CLg1-2. Some of the (2-1)st sub-marks MKa2-1'' may be located in the (3-1)st convex portion CLg2-1a of the (2-1)st connection group CLg2-1, and others of the (2-1)st sub-marks MKa2-1'' may be located in the (3-2)nd convex portion CLg2-2a of the (2-2)nd connection group CLg2-2. Some of the (2-2)nd sub-marks MKa2-2'' may be located in the (4-1)st convex portion CLg2-1b of the (2-1)st connection group CLg2-1, and others of the (2-2)nd sub-marks MKa2-2'' may be located in the (4-2)nd convex portion CLg2-2b of the (2-2)nd connection group CLg2-2.

According to some embodiments, the (1-1)st sub-marks MKa1-1'' and the (1-2)nd sub-marks MKa1-2'' may be located between protrusions of the first connection lines CL1'. The (2-1)st sub-marks MKa2-1'' and the (2-2)nd sub-marks MKa2-2'' may be located between protrusions of the second connection lines CL2'.

According to some embodiments, the first connection lines CL1' of the first connection group CLg1' may be numbered based on the first main mark MKm1''', the third main mark MKm3''', the (1-1)st sub-marks MKa1-1'', and the (1-2)nd sub-marks MKa1-2''. The second connection lines CL2' of the second connection group CLg2' may be numbered based on the second main mark MKm2''', the fourth main mark MKm4''', the (2-1)st sub-marks MKa2-1'', and the (2-2)nd sub-marks MKa2-2''.

The first main mark MKm1''' and the second main mark MKm2''' may be configured to number one hundred or more, the third main mark MKm3''' and the fourth main mark MKm4''' may be configured to number ten, and the (1-1)st sub-mark MKa1-1'', the (1-2)nd sub-mark MKa1-2'', the (2-1)st sub-mark MKa2-1'', and the (2-2)nd sub-mark MKa2-2'' may be configured to number one.

As an example, as shown in FIG. 10, each of the first main mark MKm1''' and the second main mark MKm2''' may include a two-digit number, and each of the third main mark MKm3''' and the fourth main mark MKm4''' includes a two-digit number, each of the (1-1)st sub-mark MKa1-1'', the (1-2)nd sub-mark MKa1-2'', the (2-1)st sub-mark MKa2-1'', and the (2-2)nd sub-mark MKa2-2'' may include one digit. The (1-1)st sub-marks MKa1-1'' and the (2-1)st sub-marks MKa2-1'' may each include an odd number, and the (1-2)nd sub-marks MKa1-2'' and the (2-2)nd sub-marks MKa2-2'' may each include an even number. As an example, a first first connection line CL1' may be numbered '1231' and a second first connection line CL1' may be numbered '1232'. A first second connection line CL2' may be numbered '1241' and a second second connection line CL2' may be numbered '1242'.

As described above, when the first to fourth main marks MKm1''', MKm2''', MKm3''', and MKm4''' are located between the connection groups and located in the same row, a possibility that the first to fourth main marks MKm1''', MKm2''', MKm3''', and MKm4''' are displayed on one monitor screen when the display panel is inspected increases. The first to fourth main marks MKm1''', MKm2''', MKm3''', and MKm4''' are more recognizable. In addition, because the (1-1)st sub-marks MKa1-1'', the (1-2)nd sub-marks MKa1-2'', the (2-1)st sub-marks MKa2-1'', and the (2-2)nd sub-marks MK2-2'' are also located near the first to fourth main marks MKm1''', MKm2''', MKm3''', and MKm4''', the (1-1)st sub-marks MKa1-1'', the (1-2)nd sub-marks MKa1-2'', the (2-1)st sub-marks MKa2-1'', and the (2-2)nd sub-marks MK2-2'' are also more recognizable. When the first to fourth main marks MKm1''', MKm2''', MKm3''', and MKm4''', and the (1-1)st sub-marks MKa1-1'', the (1-2)nd sub-marks MKa1-2'', the (2-1)st sub-marks MKa2-1'', and the (2-2)nd sub-marks MK2-2'' are more recognizable, the specific positions of the first and second connection lines CL1 and CL2 may be easily found, and an inspection speed of the display panel may increase.

Figure 11:
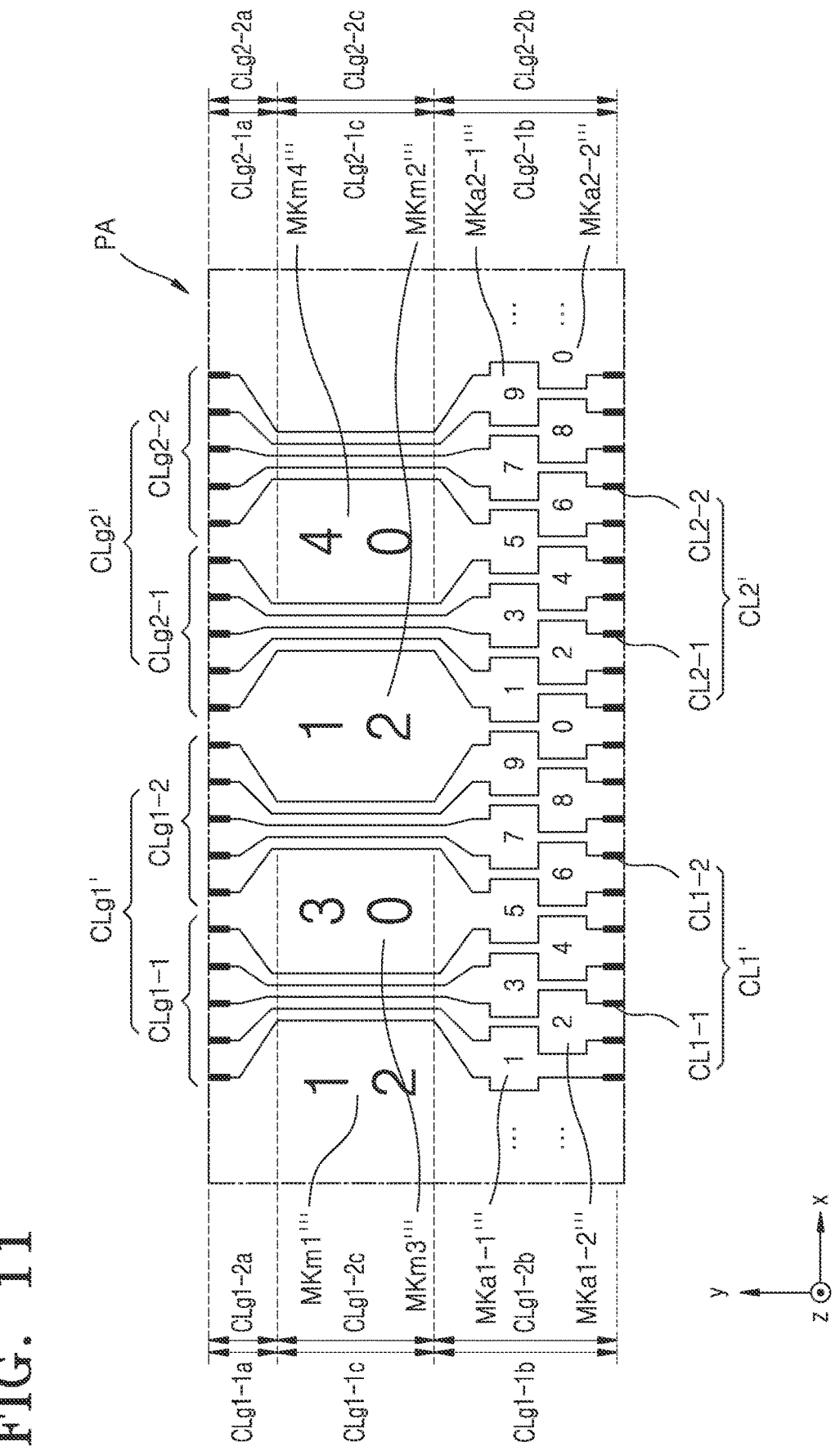
FIG. 11 is a schematic enlarged plan view of a portion of a display apparatus according to some embodiments.

FIG. 11 is a schematic enlarged plan view of a portion of a display apparatus according to some embodiments. FIG. 11 illustrates example modifications of the embodiments illustrated with respect to FIG. 10 and is different from the embodiments illustrated and described with respect to FIG. 10 in the structure of the sub-marks. Hereinafter, some repetitive descriptions of the components and features described with respect to FIG. 10 may be omitted, and differences are mainly described.

Referring to FIG. 11, the (1-1)st sub-marks MKa1-1''' and the (1-2)nd sub-marks MKa1-2''' may be located in the (1-1)st convex portion CLg1-1a of the (1-1)st connection group CLg1-1 and the (1-2)nd convex portion CLg1-2a of the (1-2)nd connection group CLg1-2, or located in the (2-1)st convex portion CLg1-1b of the (1-1)st connection group CLg1-1 and the (2-2)st convex portion CLg1-2b of the (1-2)nd connection group CLg1-2.

The (2-1)st sub-marks MKa2-1''' and the (2-2)nd sub-marks MKa2-2''' may be located in the (3-1)st convex portion CLg2-1a of the (2-1)st connection group CLg2-1 and the (3-2)nd convex portion CLg2-2a of the (2-2)nd connection group CLg2-2, or located in the (4-1)st convex portion CLg2-1b of the (2-1)st connection group CLg2-1 and the (4-2)nd convex portion CLg2-2b of the (2-2)nd connection group CLg2-2.

FIG. 11 shows an example in which the (1-1)st sub-marks MKa1-1''' and the (1-2)nd sub-marks MKa1-2''' are located in the (2-1)st convex portion CLg1-1b of the (1-1)st connection group CLg1-1 and the (2-2)nd convex portion CLg1-2b of the (1-2)nd connection group CLg1-2 and the (2-1)st sub-marks MKa2-1''' and the (2-2)nd sub-marks MKa2-2''' are located in the (4-1)st convex portion CLg2-1b of the (2-1)st connection group CLg2-1 and the (4-2)nd convex portion CLg2-2b of the (2-2)nd connection group CLg2-2.

In this case, some of the first connection lines CL1' corresponding to the (2-1)st convex portion CLg1-1b of the (1-1)st connection group CLg1-1 and the (2-2)nd convex portion CLg1-2b of the (1-2)nd connection group CLg1-2 may have a zigzag pattern. Some of the second connection lines CL2' corresponding to the (4-1)st convex portion CLg2-1*b* of the (2-1)st connection group CLg2-1 and the (4-2)nd convex portion CLg2-2*b* of the (2-2)nd connection group CLg2-2 may have a zigzag pattern. The (1-1)st sub-marks MKa1-1''' and the (1-2)nd sub-marks MKa1-2''' may be located between the zigzag patterns of the first connection lines CL1', and the (2-1)st sub-marks MKa2-1''' and the (2-2)nd sub-marks MKa2-2''' may be located between the zigzag patterns of the second connection lines CL2'.

The (1-1)st sub-marks MKa1-1''' and the (1-2)nd sub-marks MKa1-2''' may be located in different rows, and the (2-1)st sub-marks MKa2-1''' and the (2-2)nd sub-marks MKa2-2''' may be located in different rows. The (1-1)st sub-marks MKa1-1''' and the (1-2)nd sub-marks MKa1-2''' may be located in different columns, and the (2-1)st sub-marks MKa2-1''' and the (2-2)nd sub-marks MKa2-2''' may be located in different columns. The (1-1)st sub-marks MKa1-1''' and the (2-1)st sub-marks MKa2-1''' may be located in the same row, and the (1-2)nd sub-marks MKa1-2''' and the (2-2)nd sub-marks MKa2-2''' may be located in the same row. In this case, the (1-1)st sub-marks MKa1-1''' and the (2-1)st sub-marks MKa2-1''' may each include an odd number, and the (1-2)nd sub-marks MKa1-2''' and the (2-2)nd sub-marks MKa2-2''' may each include an even number.

Though description has been mainly made to the display apparatus to the point, the embodiments according to the present disclosure are not limited thereto. As an example, a method of manufacturing a display apparatus to manufacture the display apparatus also falls within the scope of the disclosure.

According to some embodiments, a display apparatus with an increased inspection speed of the display panel, wherein the locations of the connection lines electrically connected to the data lines are swiftly determined may be implemented. However, the scope of embodiments according to the disclosure are not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a substrate including a display area and a peripheral area surrounding at least a portion of the display area;
a pad portion on one side of the peripheral area;
a first connection group including a plurality of first connection lines extending from the pad portion to the display area;
a second connection group including a plurality of second connection lines extending from the pad portion to the display area, wherein the second connection group is adjacent to the first connection group;
a first main mark located on a first side of the first connection group;
a second main mark located on a second side of the first connection group and located between the first connection group and the second connection group;

a plurality of first sub-marks each located between the plurality of first connection lines of the first connection group; and
a plurality of second sub-marks each located between the plurality of second connection lines of the second connection group.

2. The display apparatus of claim 1, wherein the plurality of first connection lines of the first connection group are numbered based on the first main mark and the plurality of first sub-marks, and
the plurality of second connection lines of the second connection group are numbered based on the second main mark and the plurality of second sub-marks.

3. The display apparatus of claim 1, wherein the first connection group includes a first convex portion, a second convex portion, and a first concave portion between the first convex portion and the second convex portion,
the second connection group includes a third convex portion, a fourth convex portion, and a second concave portion between the third convex portion and the fourth convex portion,
the first main mark is located on one side of the first concave portion of the first connection group, and
the second main mark is located between the first concave portion of the first connection group and the second concave portion of the second connection group.

4. The display apparatus of claim 3, wherein (1-1)st sub-marks in the plurality of first sub-marks are located in the first convex portion of the first connection group,
(1-2)nd sub-marks in the plurality of first sub-marks are located in the second convex portion of the first connection group,
(2-1)st sub-marks in the plurality of second sub-marks are located in the third convex portion of the second connection group, and
(2-2)nd sub-marks in the plurality of second sub-marks are located in the fourth convex portion of the second connection group.

5. The display apparatus of claim 4, wherein some of the plurality of first connection lines corresponding to the first convex portion of the first connection group have first protrusions,
others of the plurality of first connection lines corresponding to the second convex portion of the first connection group have second protrusions,
some of the plurality of second connection lines corresponding to the third convex portion of the second connection group have third protrusions,
others of the plurality of second connection lines corresponding to the fourth convex portion of the second connection group have fourth protrusions,
the (1-1)st sub-marks each are located between the first protrusions,
the (1-2)nd sub-marks each are located between the second protrusions,
the (2-1)st sub-marks each are located between the third protrusions, and
the (2-2)nd sub-marks each are located between the fourth protrusions.

6. The display apparatus of claim 5, wherein the first protrusions include (1-1)st protrusions protruding in a first direction and (1-2)nd protrusions protruding in a second direction opposite to the first direction,
the second protrusions include (2-1)st protrusions protruding in the first direction and (2-2)nd protrusions protruding in the second direction, the third protrusions include (3-1)st protrusions protruding in the first direction and (3-2)nd protrusions protruding in the second direction, the fourth protrusions include (4-1)st protrusions protruding in the first direction and (4-2)nd protrusions protruding in the second direction, the (1-1)st protrusions and the (1-2)nd protrusions are alternately arranged, the (2-1)st protrusions and the (2-2)nd protrusions are alternately arranged, the (3-1)st protrusions and the (3-2)nd protrusions are alternately arranged, and the (4-1)st protrusions and the (4-2)nd protrusions are alternately arranged.

7. The display apparatus of claim 4, wherein the (1-1)st sub-marks and the (2-1)st sub-marks each include an odd number, and the (1-2)nd sub-marks and the (2-2)nd sub-marks each include an even number.

8. The display apparatus of claim 3, wherein the plurality of first sub-marks are located in one of the first convex portion and the second convex portion of the first connection group, and the plurality of second sub-marks are located in one of the third convex portion and the fourth convex portion of the second connection group.

9. The display apparatus of claim 8, wherein some of the plurality of first connection lines corresponding to one of the first convex portion and the second convex portion of the first connection group have a zigzag pattern, and some of the plurality of second connection lines corresponding to one of the third convex portion and the fourth convex portion of the second connection group have a zigzag pattern.

10. The display apparatus of claim 8, wherein the plurality of first sub-marks include (1-1)st sub-marks and (1-2)nd sub-marks located in different rows, and the plurality of second sub-marks include (2-1)st sub-marks and (2-2)nd sub-marks located in different rows.

11. The display apparatus of claim 10, wherein the (1-1)st sub-marks and the (2-1)st sub-marks each include an odd number, and the (1-2)nd sub-marks and the (2-2)nd sub-marks each include an even number.

12. The display apparatus of claim 10, wherein the (1-1)st sub-marks and the (2-1)st sub-marks are arranged in a same row, and the (1-2)nd sub-marks and the (2-2)nd sub-marks are arranged in a same row.

13. The display apparatus of claim 1, wherein the first connection group includes a (1-1)st connection group including (1-1)st connection lines in the plurality of first connection lines and a (1-2)nd connection group including (1-2)nd connection lines in the plurality of first connection lines, the second connection group includes a (2-1)st connection group including (2-1)st connection lines in the plurality of second connection lines and a (2-2)nd connection group including (2-2)nd connection lines in the plurality of second connection lines, the first main mark is located on one side of the (1-1)st connection group, the second main mark is located between the (1-2)nd connection group and the (2-1)st connection group, the display apparatus further includes:

a third main mark located between the (1-1)st connection group and the (1-2)nd connection group; and a fourth main mark located between the (2-1)st connection group and the (2-2)nd connection group, wherein the plurality of first connection lines of the first connection group are numbered based on the first main mark, the third main mark, and the plurality of first sub-marks, and the plurality of second connection lines of the second connection group are numbered based on the second main mark, the fourth main mark, and the plurality of second sub-marks.

14. The display apparatus of claim 13, wherein the plurality of first sub-marks include (1-1)st sub-marks and (1-2)nd sub-marks arranged in different rows, the plurality of second sub-marks include (2-1)st sub-marks and (2-2)nd sub-marks arranged in different rows, the (1-1)st sub-marks and the (2-1)st sub-marks are arranged in a same row, and the (1-2)nd sub-marks and the (2-2)nd sub-marks are arranged in a same row, the (1-1)st sub-marks and the (2-1)st sub-marks each include an odd number, and the (1-2)nd sub-marks and the (2-2)nd sub-marks each include an even number.

15. The display apparatus of claim 14, wherein the (1-1)st connection group includes a (1-1)st convex portion, a (2-1)st convex portion, and a (1-1)st concave portion between the (1-1)st convex portion and the (2-1)st convex portion, the (1-2)nd connection group includes a (1-2)nd convex portion, a (2-2)nd convex portion, and a (1-2)nd concave portion between the (1-2)nd convex portion and the (2-2)nd convex portion, the (2-1)st connection group includes a (3-1)st convex portion, a (4-1)st convex portion, and a (2-1)st concave portion between the (3-1)st convex portion and the (4-1)st convex portion, the (2-2)nd connection group includes a (3-2)nd convex portion, a (4-2)nd convex portion, and a (2-2)nd concave portion between the (3-2)nd convex portion and the (4-2)nd convex portion, the first main mark is located on one side of the (1-1)st concave portion of the (1-1)st connection group, the second main mark is located between the (1-2)nd concave portion of the (1-2)nd connection group and the (2-1)st concave portion of the (2-1)st connection group, the third main mark is located between the (1-1)st concave portion of the (1-1)st connection group and the (1-2)nd concave portion of the (1-2)nd connection group, the fourth main mark is located between the (2-1)st concave portion of the (2-1)st connection group and the (2-2)nd concave portion of the (2-2)nd connection group, some of the (1-1)st sub-marks are located in the (1-1)st convex portion of the (1-1)st connection group, others of the (1-1)st sub-marks are located in the (1-2)nd convex portion of the (1-2)nd connection group, some of the (1-2)nd sub-marks are located in the (2-1)st convex portion of the (1-1)st connection group, others of the (1-2)nd sub-marks are located in the (2-2)nd convex portion of the (1-2)nd connection group, some of the (2-1)st sub-marks are located in the (3-1)st convex portion of the (2-1)st connection group, others of the (2-1)st sub-marks are located in the (3-2)nd convex portion of the (2-2)nd connection group, some of the (2-2)nd sub-marks are located in the (4-1)st convex portion of the (2-1)st connection group, and others of the (2-2)nd sub-marks are located in the (4-2)nd convex portion of the (2-2)nd connection group.

16. The display apparatus of claim 14, further comprising the (1-1)st connection group includes a (1-1)st convex portion, a (2-1)st convex portion, and a (1-1)st concave portion between the (1-1)st convex portion and the (2-1)st convex portion, wherein the (1-2)nd connection group includes a (1-2)nd convex portion, a (2-2)nd convex portion, and a (1-2)nd concave portion between the (1-2)nd convex portion and the (2-2)nd convex portion, the (2-1)st connection group includes a (3-1)st convex portion, a (4-1)st convex portion, and a (2-1)st concave portion between the (3-1)st convex portion and the (4-1)st convex portion, the (2-2)nd connection group includes a (3-2)nd convex portion, a (4-2)nd convex portion, and a (2-2)nd concave portion between the (3-2)nd convex portion and the (4-2)nd convex portion, the first main mark is located on one side of the (1-1)st concave portion of the (1-1)st connection group, the second main mark is located between the (1-2)nd concave portion of the (1-2)nd connection group and the (2-1)st concave portion of the (2-1)st connection group, the third main mark is located between the (1-1)st concave portion of the (1-1)st connection group and the (1-2)nd concave portion of the (1-2)nd connection group, the fourth main mark is located between the (2-1)st concave portion of the (2-1)st connection group and the (2-2)nd concave portion of the (2-2)nd connection group, the plurality of first sub-marks are located in the (1-1)st convex portion of the (1-1)st connection group and the (1-2)nd convex portion of the (1-2)nd connection group, or located in the (2-1)st convex portion of the (1-1)st connection group and the (2-2)nd convex portion of the (1-2)nd connection group, and the plurality of second sub-marks are located in the (3-1)st convex portion of the (2-1)st connection group and the (3-2)nd convex portion of the (2-2)nd connection group, or located in the (4-1)st convex portion of the (2-1)st connection group and the (4-2)nd convex portion of the (2-2)nd connection group.

17. The display apparatus of claim 1, further comprising a plurality of data lines extending in one direction in the display area, wherein the plurality of first connection lines and the plurality of second connection lines are electrically connected to the plurality of data lines.

\* \* \* \* \*